United States Patent
Kim et al.

(10) Patent No.: US 9,261,940 B2
(45) Date of Patent: Feb. 16, 2016

(54) MEMORY SYSTEM CONTROLLING PEAK CURRENT GENERATION FOR A PLURALITY OF MEMORIES BY MONITORING A PEAK SIGNAL TO SYNCHRONIZE AN INTERNAL CLOCK OF EACH MEMORY BY A PROCESSOR CLOCK AT DIFFERENT TIMES

(75) Inventors: Bo-geun Kim, Suwon-Si (KR);
Kye-hyun Kyung, Yongin-Si (KR);
Jae-yong Jeong, Yongin-Si (KR);
Seung-hun Choi, Yongin-Si (KR);
Seok-cheon Kwon, Yongin-Si (KR);
Chul-ho Lee, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 848 days.

(21) Appl. No.: 13/396,618

(22) Filed: Feb. 15, 2012

(65) Prior Publication Data

US 2012/0221880 A1    Aug. 30, 2012

(30) Foreign Application Priority Data

Feb. 25, 2011  (KR) .................. 10-2011-0017293
Jun. 28, 2011  (KR) .................. 10-2011-0063039

(51) Int. Cl.
| | |
|---|---|
| *G06F 1/12* | (2006.01) |
| *G06F 13/42* | (2006.01) |
| *H04L 5/00* | (2006.01) |
| *H04L 7/00* | (2006.01) |
| *G06F 1/32* | (2006.01) |
| *G06F 1/14* | (2006.01) |
| *G06F 13/16* | (2006.01) |
| *G06F 1/04* | (2006.01) |
| *G11C 7/22* | (2006.01) |

(52) U.S. Cl.
CPC ............ *G06F 1/3225* (2013.01); *G06F 1/04* (2013.01); *G06F 1/14* (2013.01); *G06F 1/3203* (2013.01); *G06F 1/3275* (2013.01); *G06F 13/1689* (2013.01); *G11C 7/222* (2013.01); *Y02B 60/1228* (2013.01)

(58) Field of Classification Search
CPC ....... G06F 1/3225; G06F 1/3275; G06F 1/04; G06F 1/14; G06F 1/3203; G06F 13/1689; G11C 7/222
See application file for complete search history.

(56) References Cited

U.S. PATENT DOCUMENTS

| | | | | |
|---|---|---|---|---|
| 7,656,711 | B2 | 2/2010 | Shibata et al. | |
| 2002/0103962 | A1* | 8/2002 | Toda | 711/105 |
| 2006/0056257 | A1* | 3/2006 | Origasa | 365/222 |
| 2007/0279988 | A1* | 12/2007 | Nguyen | 365/185.18 |
| 2008/0059831 | A1* | 3/2008 | Campbell | 713/600 |
| 2008/0192548 | A1* | 8/2008 | Shibata et al. | 365/185.17 |
| 2009/0267674 | A1* | 10/2009 | Hwang | 327/295 |
| 2010/0097864 | A1* | 4/2010 | Shibata et al. | 365/185.18 |
| 2010/0194434 | A1* | 8/2010 | Vo et al. | 326/93 |
| 2011/0173462 | A1* | 7/2011 | Wakrat et al. | 713/300 |
| 2012/0063234 | A1* | 3/2012 | Shiga et al. | 365/185.22 |
| 2012/0265949 | A1* | 10/2012 | Shimizu | 711/154 |

* cited by examiner

*Primary Examiner* — Thomas Lee
*Assistant Examiner* — Zhipeng Wang
(74) *Attorney, Agent, or Firm* — Volentine & Whitt, PLLC

(57) ABSTRACT

A memory system includes a controller that generates a processor clock, and a plurality of memory devices each including an internal clock generator that generates an internal clock in synchronization with the processor clock, and a memory that performs a peak current generation operation in synchronization with the internal clock, wherein at least two of the memory devices generate their respective internal clocks at different times such that the corresponding peak current generation operations are performed at different times.

10 Claims, 26 Drawing Sheets

| ① | ② | ③ | ④ | ⑤ | ⑥ | ⑦ |
|---|---|---|---|---|---|---|
| Program Data Setup | Program BL Setup | Program Execution | PB Sel | Verify BL Precharge | Sensing & Latch | Page Check |

MEMORY SYSTEM CONTROLLING PEAK CURRENT GENERATION FOR A PLURALITY OF MEMORIES BY MONITORING A PEAK SIGNAL TO SYNCHRONIZE AN INTERNAL CLOCK OF EACH MEMORY BY A PROCESSOR CLOCK AT DIFFERENT TIMES

CROSS-REFERENCE TO RELATED APPLICATIONS

This application claims priority under 35 U.S.C. §119 to Korean Patent Application No. 10-2011-0017293 filed on Feb. 25, 2011 and Korean Patent Application No. 10-2011-0063039 filed on Jun. 28, 2011, the respective disclosures of which are hereby incorporated by reference.

BACKGROUND OF THE INVENTION

The inventive concept relates generally to electronic data storage technologies. More particularly, the inventive concept relates to semiconductor memory systems and related methods of operation.

The design of semiconductor memory systems typically involves tradeoffs. For example, there are often tradeoffs between cost, reliability, performance, power consumption, and so on.

In a memory system having multiple semiconductor memory devices, different power management techniques can present tradeoffs between reliability and performance. For example, in such a system, the peak currents of different memory devices may overlap, which can lead to malfunction or operational deterioration of the semiconductor memory system. However, if control operations are performed to prevent the overlapping of the peak currents, the semiconductor memory system may experience operational delays.

SUMMARY OF THE INVENTION

In one embodiment of the inventive concept, a memory system comprises a plurality of memory devices and a controller. Each of the memory devices comprises an internal clock generator that generates an internal clock in synchronization with a processor clock received from the controller, in response to the processor clock, and a memory that performs a peak current generation operation within a peak current generation period in synchronization with the internal clock. Two or more of the memory devices generate their respective internal clocks at different times.

In another embodiment of the inventive concept, a memory system comprises a plurality of memory devices and a memory controller. Each of the memory devices comprises an internal clock generator that generates an internal clock in synchronization with a processor clock received from the memory controller, and a memory that performs a peak current generation operation in response to a peak signal received from different memory devices via a signal line for connecting the memory devices, in synchronization with the internal clock.

In another embodiment of the inventive concept, a method is provided for controlling a memory system comprising a plurality of memory devices and a controller. The method comprises transmitting a clock signal from the controller to the plurality of memory devices, generating an internal clock in each of the memory devices in synchronization with the processor clock, wherein two or more of the memory devices generate their respective internal clocks at different times, and performing peak current generation operations in the memory devices at different times according to their respective internal clocks.

These and other embodiments of the inventive concept can potentially improve reliability of semiconductor devices by reducing malfunctions caused by overlapping peak currents. In addition, they can do this without significantly impairing the performance of the semiconductor devices.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

Figure 1:
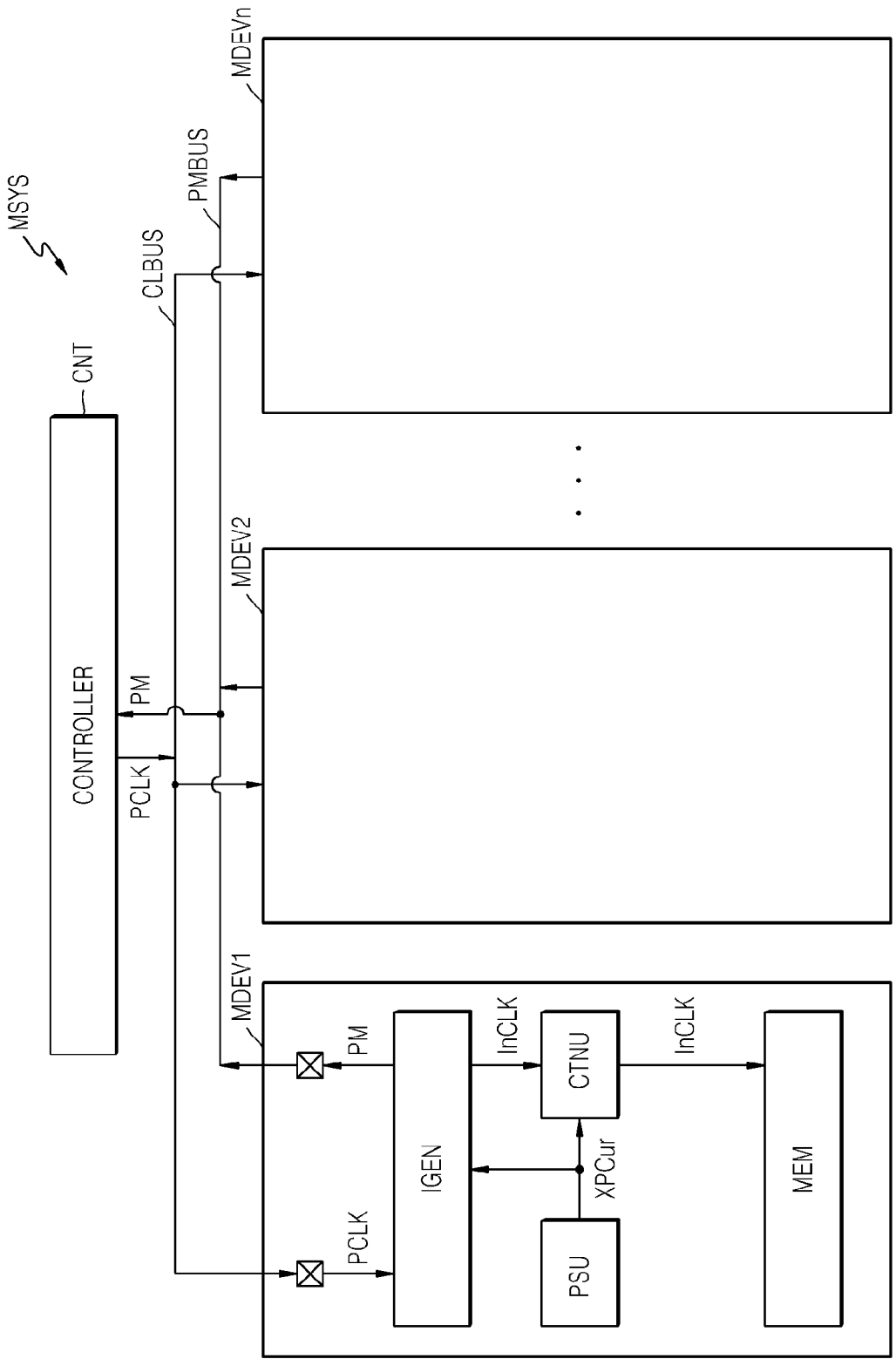
FIG. 1 is a block diagram of a memory system according to an embodiment of the inventive concept.

FIG. 1 is a block diagram of a memory system MSYS according to an embodiment of the inventive concept.

Referring to FIG. 1, memory system MSYS comprises a controller CNT and first through n-th memory devices MDEV1 through MDEVn. Controller CNT and first through n-th memory devices MDEV1 through MDEVn are connected to each other via a processor clock bus CLBUS and a peak signal bus PMBUS. First through n-th memory devices MDEV1 through MDEVn can be NAND flash memory devices or various other types of memory devices. The number of memory devices "n" in memory system MSYS is an integer greater than or equal to 2. Also, memory system MSYS may further comprise command and/or data buses for performing command and/or data communication between controller CNT and first through n-th memory devices MDEV1 through MDEVn.

Figures 2, 3:
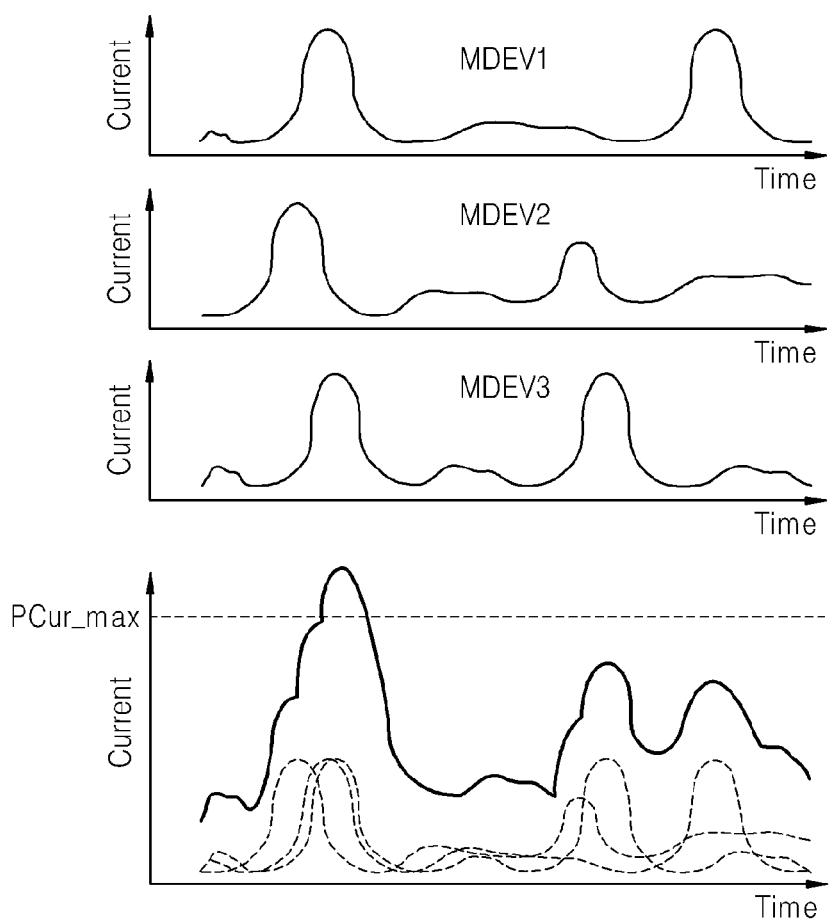
FIG. 2 is a diagram showing sub-operations of a program operation of the memory system of FIG. 1.
FIG. 3 includes graphs showing overlapping peak currents of memory devices in the memory system of FIG. 1.

Each of first through n-th memory devices MDEV1 through MDEVn comprises an internal clock generator IGEN and a memory MEM. Internal clock generator IGEN generates an internal clock InCLK in synchronization with a processor clock PCLK. Memory MEM typically comprises a memory cell array, a driver, and a voltage generator. An operation of controlling memory MEM to generate a peak current PCur in synchronization with internal clock InCLK generated by internal clock generator IGEN, in each of first through n-th memory devices MDEV1 through MDEVn, will be described in detail below. Each of first through n-th memory devices MDEV1 through MDEVn further comprises control logic CTNU. Control logic CTNU sets a start time of internal clock InCLK according to the operational characteristics of first through n-th memory devices MDEV1 through MDEVn.

Where first through n-th memory devices MDEV1 through MDEVn are NAND flash memory devices, certain types of erase, program, verify, and read operations are performed to write and read data in and from the memory cell array in memory MEM. For example, as illustrated in FIG. 2, a typical program operation of memory MEM comprises program data setup (①), program bitline setup (②), program execution (③), page buffer setting (④), verification bitline precharge (⑤), sensing and latching (⑥), and page checking (⑦) operations. However, during the program operation, a certain operation may be repeated or omitted according to operational characteristics of first through n-th memory devices MDEV1 through MDEVn.

Where the above program operation is performed, each of first through n-th memory devices MDEV1 through MDEVn generates a peak current PCur. In general, an operation where a memory device generates a peak current will be referred to as a peak current generation operation. For example, the program bitline setup and verification bitline precharge operations may be peak current generation operations. However, if peak currents PCur of first through n-th memory devices MDEV1 through MDEVn overlap each other, an overall peak current PCur of memory system MSYS may be greater than a maximum peak current PCur_Max of memory system MSYS, as illustrated in FIG. 3.

Figure 4:
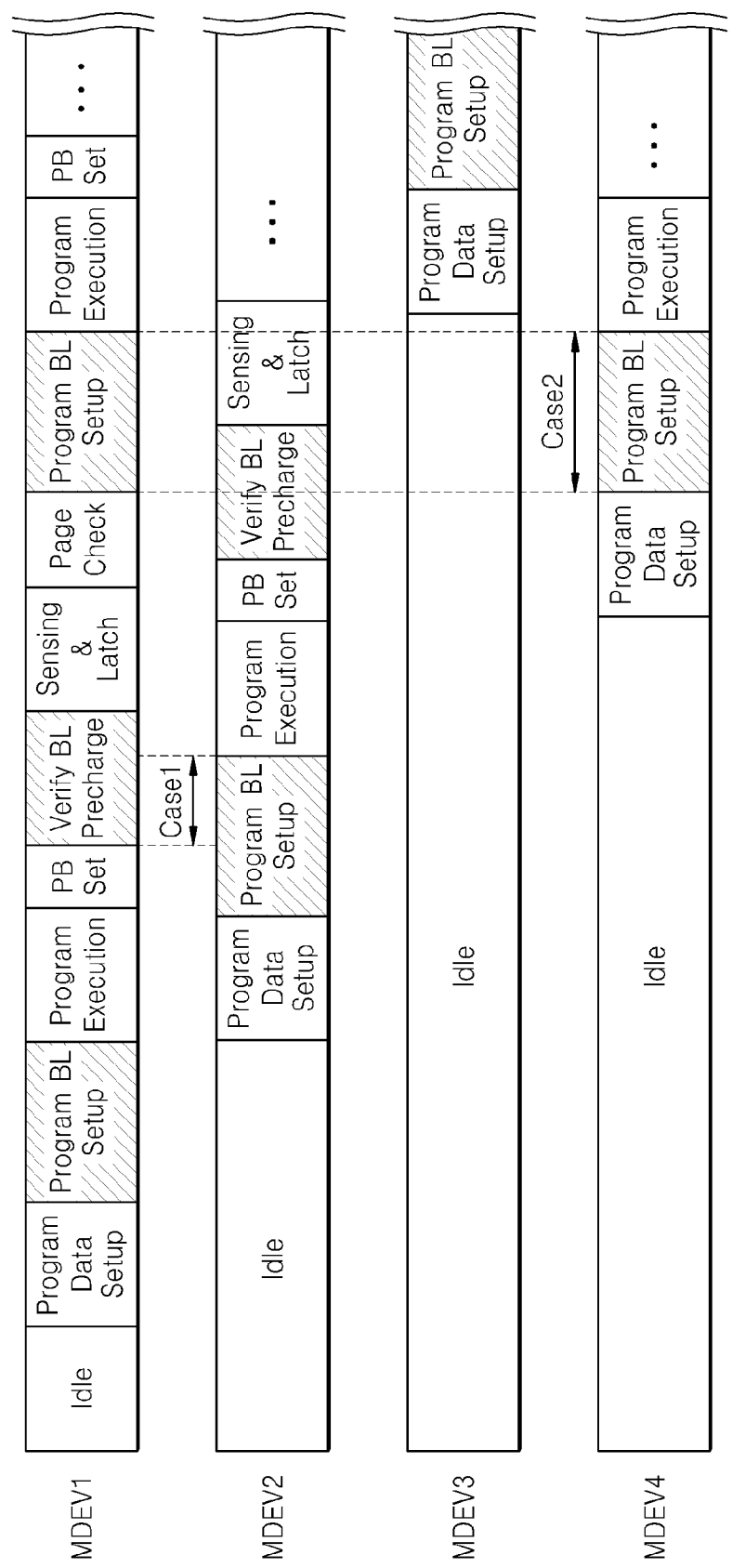
FIG. 4 is a diagram illustrating example situations where peak currents of different memory devices overlap each other in the memory system of FIG. 1.

FIG. 4 is a diagram illustrating example situations where peak currents PCur of first through n-th memory devices MDEV1 through MDEVn overlap each other in memory system MSYS of FIG. 1. As illustrated in FIG. 4, where each of first through n-th memory devices MDEV1 through MDEVn generates a peak current PCur in the program bitline setup and verification bitline precharge operations of the program operation of FIG. 2, and where first memory device MDEV1 starts the verification bitline precharge operation while second memory device MDEV2 performs the program bitline setup operation, peak currents PCur generated by the first and second memory devices MDEV1 and MDEV2 overlap each other in a region labeled "Case1". Similarly, where first or fourth memory device MDEV1 or MDEV4 starts the program bitline setup operation while second memory device MDEV2 performs the verification bitline precharge operation, peak currents PCur generated by first or fourth memory device MDEV1 or MDEV4 and second memory device MDEV2 overlap each other in a region labeled "Case2".

In a conventional memory system, a very large peak current may be temporarily generated during Case1 or Case2, causing the memory system to be powered off. Accordingly, the reliability of the memory system may be reduced. However, memory system MSYS controls generation of peak currents PCur generated by first through n-th memory devices MDEV1 through MDEVn to prevent a reduction in reliability, as described below.

Figure 7:
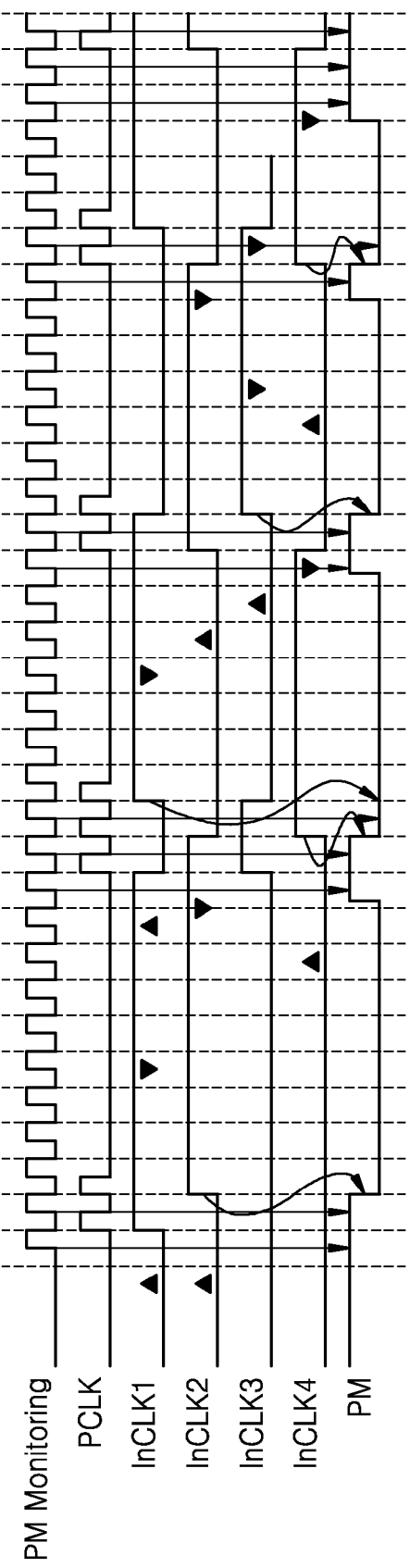

Because first through n-th memory devices MDEV1 through MDEVn are connected to each other and to controller CNT via peak signal bus PMBUS, where a logic level of a peak signal PM of one memory device transitions, the logic level of peak signal PM transmitted to controller CNT via peak signal bus PMBUS may transition accordingly. However, the logic level of peak signal PM transmitted to controller CNT via peak signal bus PMBUS is not always determined by one memory device. As illustrated in FIG. 7, a peak signal having a logic level corresponding to logic levels of peak signals of two or more memory devices may be transmitted to controller CNT.

Figure 5:
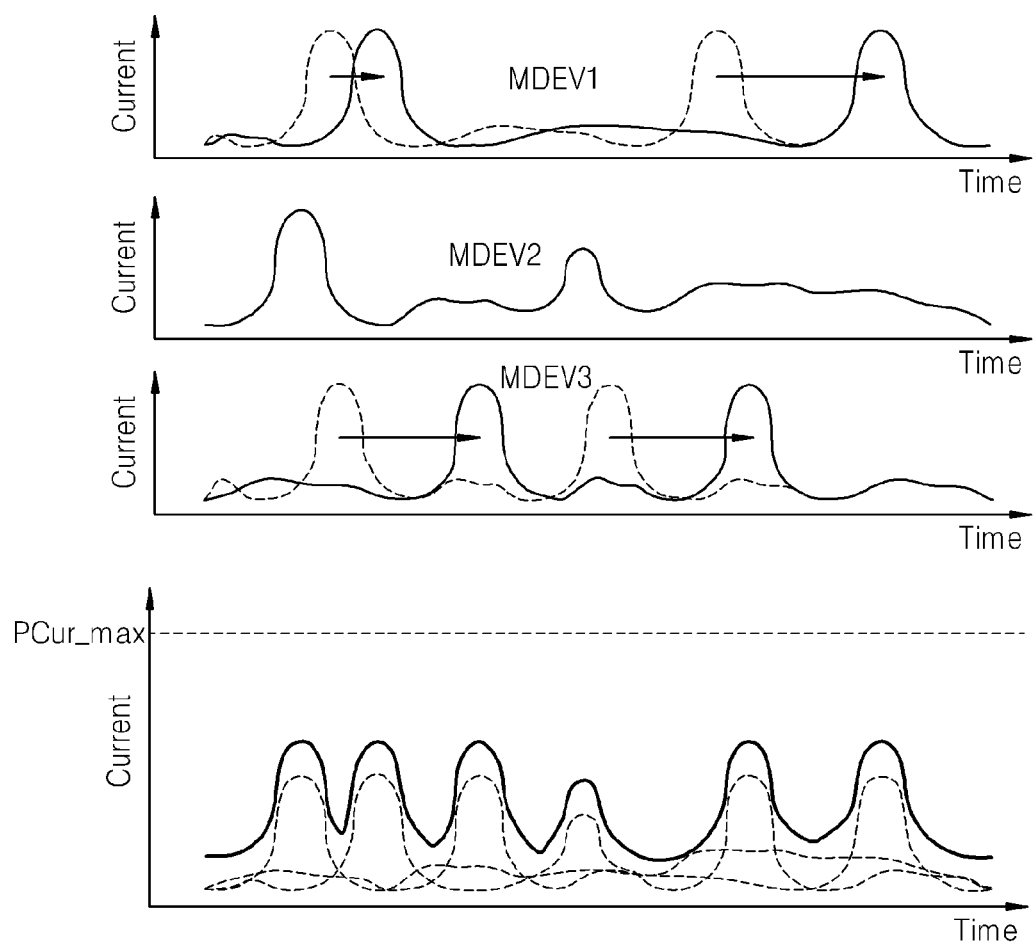
FIG. 5 includes graphs illustrating a scheme for controlling peak currents of memory devices in the memory system of FIG. 1.

Controller CNT activates processor clock PCLK differently in response to peak signal PM transmitted from first through n-th memory devices MDEV1 through MDEVn. Where peak signal PM having a logic low ("L") level is received, controller CNT does not apply processor clock PCLK to first through n-th memory devices MDEV1 through MDEVn and controls first through n-th memory devices MDEV1 through MDEVn not to additionally generate peak currents PCur. That is, as illustrated in FIG. 5, if a certain memory device (e.g., MDEV2) generates peak current PCur and thus peak signal PM has logic "L", controller CNT delays (see arrows) generation of peak currents PCur in other memory devices (e.g., MDEV1 and MDEV3), and controls first through n-th memory devices MDEV1 through MDEVn not to simultaneously generate peak currents PCur. As such, in all periods, a sum of currents generated by first through n-th memory devices MDEV1 through MDEVn is less than maximum peak current PCur_Max of memory system MSYS.

Memory system MSYS can control generation of peak currents PCur in first through n-th memory devices MDEV1 through MDEVn according to various conditions, e.g., the size of maximum peak current PCur_Max of memory system MSYS and the size of a peak current PCur of each of first through n-th memory devices MDEV1 through MDEVn, as described below.

Figure 6:
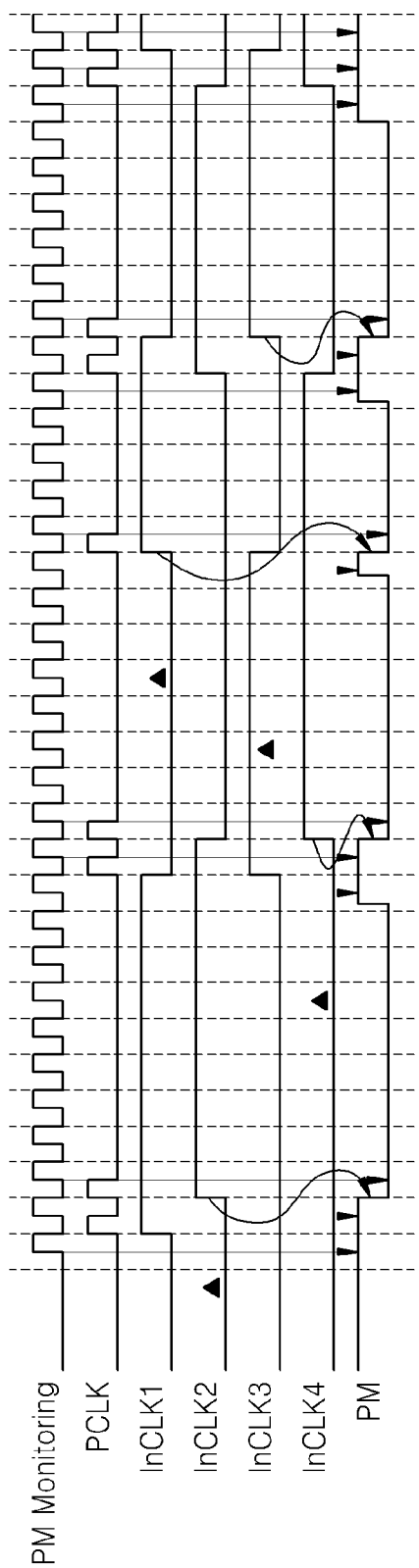
FIGS. 6 and 7 are timing diagrams illustrating a method of controlling peak currents of memory devices in the memory system of FIG. 1 according to an embodiment of the inventive concept.

FIG. 6 is a timing diagram illustrating a method of controlling peak currents PCur between first through n-th memory devices MDEV1 through MDEVn in memory system MSYS of FIG. 1 according to an embodiment of the inventive concept.

Referring to FIGS. 1 and 6, controller CNT monitors peak signal PM in a short cycle less than or equal to 100 ns. In a period when peak signal PM is in a logic high ("H") level, i.e., when first through n-th memory devices MDEV1 through MDEVn do not generate peak currents PCur, controller CNT transmits processor clock PCLK to first through n-th memory devices MDEV1 through MDEVn via processor clock bus CLBUS. Internal clock generator IGEN of each of first through n-th memory devices MDEV1 through MDEVn receives processor clock PCLK and generates internal clock InCLK in synchronization with processor clock PCLK as described above in relation to FIG. 1. Hereinafter, internal clock InCLK generated by first memory device MDEV1 is referred to as a first internal clock InCLK1, internal clock InCLK generated by second memory device MDEV2 is referred to as a second internal clock InCLK2, and so on.

In FIG. 6, if peak signal PM is detected at logic "H", i.e., if first through n-th memory devices MDEV1 through MDEVn do not generate peak currents PCur, controller CNT applies processor clock PCLK to first through n-th memory devices MDEV1 through MDEVn. From among first through n-th memory devices MDEV1 through MDEVn that receive processor clock PCLK, first memory device MDEV1 that does not need to perform a peak current generation operation generates first internal clock InCLK1 regardless of the operations of other memory devices. Also, a logic level of peak signal PM is not changed by first memory device MDEV1 that does not perform the peak current generation operation.

On the other hand, from among first through n-th memory devices MDEV1 through MDEVn that receive processor clock PCLK, second memory device MDEV2 that is ready to perform the peak current generation operation (see a triangle) is activated in response to a subsequent pulse of processor clock PCLK. Second memory device MDEV2 starts the peak current generation operation (e.g., the program bitline setup operation of FIG. 2) in synchronization with second internal clock InCLK2. As such, second memory device MDEV2 changes the logic level of peak signal PM. That is, because second memory device MDEV2 starts the peak current generation operation in synchronization with second internal clock InCLK2, the logic level of peak signal PM transmitted to controller CNT via peak signal bus PMBUS transitions (e.g., to logic "L").

Where controller CNT detects that the logic level of peak signal PM transitions to logic "L", controller CNT does not generate processor clock PCLK. Accordingly, third and fourth internal clocks InCLK3 and InCLK4 of the third and fourth memory devices MDEV3 and MDEV4 are not activated. In other words, while one memory device generates peak current PCur, other memory devices do not generate peak currents PCur. Consequently, peak current PCur of memory system MSYS does not rise above maximum peak current PCur_Max, as illustrated in FIG. 3.

After performing the peak current generation operation, second memory device MDEV2 changes the logic level of peak signal PM (e.g., to logic "H"). In this case, controller CNT monitors the logic level of peak signal PM and activates processor clock PCLK. As such, third internal clock InCLK3 is activated in synchronization with processor clock PCLK. However, because third internal clock InCLK3 of third memory device MDEV3, which does not need to perform the peak current generation operation, does not change the logic level of peak signal PM, processor clock PCLK is continuously generated and fourth internal clock InCLK4 is activated in synchronization with processor clock PCLK. Because fourth internal clock InCLK4 of fourth memory device MDEV4, which is ready to start the peak current generation operation, is activated, fourth memory device MDEV4 performs the peak current generation operation. Because fourth memory device MDEV4 generates peak current PCur, it changes the logic level of peak signal PM.

As such, according to an embodiment of the inventive concept, memory devices generate peak currents in synchronization with a processor clock of a controller, and they generate internal clocks that are activated at different times (different edges of the processor clock). Consequently, peak currents of the memory devices are prevented from overlapping each other.

Although internal clocks of all memory devices are activated at different times in FIG. 6, the inventive concept is not limited to using this mechanism to prevent overlapping peak currents. As illustrated in FIG. 7, internal clocks of two or more memory devices may be simultaneously generated at one time, and a plurality of memory devices may simultaneously perform a peak current generation operation, as described below.

FIG. 7 is a timing diagram illustrating a method of controlling peak currents PCur between first through n-th memory devices MDEV1 through MDEVn in memory system MSYS of FIG. 1 according to another embodiment of the inventive concept.

Referring to FIGS. 1 and 7, if peak signal PM is detected as logic "H", controller CNT applies processor clock PCLK to first through n-th memory devices MDEV1 through MDEVn. From among first through n-th memory devices MDEV1 through MDEVn that receive processor clock PCLK, internal clock generator IGEN of first memory device MDEV1, which is ready to start a peak current generation operation, generates first internal clock InCLK1 in synchronization with processor clock PCLK. However, a sum of peak currents PCur simultaneously generated by two or more memory devices may be less than maximum peak current PCur_Max of memory system MSYS, as shown in FIG. 5. In this case, memory system MSYS may allow two or more memory devices to simultaneously generate peak current PCur.

Accordingly, although first memory device MDEV1 performs the peak current generation operation, peak signal PM is maintained at logic "H". In this case, although the logic level of peak signal PM of first memory device MDEV1 transitions, the logic level of peak signal PM monitored by controller CNT is maintained. For example, where a transistor that has one terminal connected to peak signal bus PMBUS and is gated by peak signal PM is included, and a voltage level of peak signal bus PMBUS voltage-dropped by peak signal PM of one memory device does not cause a voltage drop by a transistor of controller CNT for sensing the logic level of peak signal PM connected to peak signal bus PMBUS and transmitted via peak signal bus PMBUS, the logic level of peak signal PM monitored by controller CNT is maintained.

Accordingly, because peak signal PM is still detected at logic "H" in a period where first memory device MDEV1 performs the peak current generation operation, controller CNT applies processor clock PCLK to first through n-th memory devices MDEV1 through MDEVn. From among first through n-th memory devices MDEV1 through MDEVn that receive processor clock PCLK, internal clock generator IGEN of second memory device MDEV2 that is ready to start the peak current generation operation generates second internal clock InCLK2 in synchronization with processor clock PCLK. Consequently, first and second memory devices MDEV1 and MDEV2 simultaneously generate peak currents PCur and, if only two memory devices are allowed to simultaneously generate peak currents PCur, peak signal PM transitions to logic "L".

Where peak signal PM is detected at logic "L", controller CNT does not apply processor clock PCLK to first through n-th memory devices MDEV1 through MDEVn. Then, after the peak current generation operation of first memory device MDEV1 is completed, peak signal PM transitions to logic "H". Where peak signal PM is detected at logic "H", controller CNT applies processor clock PCLK to first through n-th memory devices MDEV1 through MDEVn again, and the above-described operation is repeated.

Although two memory devices are allowed to simultaneously generate peak currents PCur in FIG. 7, the inventive concept is not limited thereto. For example, memory system MSYS may set the number of memory devices to simultaneously perform the peak current generation operation in consideration of the size of maximum peak current PCur_Max of memory system MSYS and the size of a peak current PCur of each of first through n-th memory devices MDEV1 through MDEVn. Accordingly, memory system MSYS may adaptively set the number of memory devices allowed to simultaneously perform a peak current generation operation. Consequently, it may efficiently control the generation of peak currents and reduce operational delays of memory devices.

Figure 8:
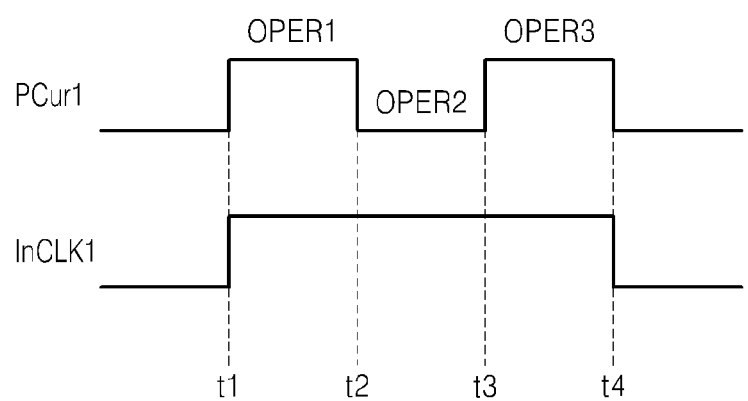
FIG. 8 is a timing diagram for a method of generating an internal clock of a memory device in the memory system of FIG. 1 according to an embodiment of the inventive concept.

FIG. 8 is a timing diagram illustrating a method of generating first internal clock InCLK1 of first memory device MDEV1 in memory system MSYS of FIG. 1 according to an embodiment of the inventive concept.

Referring to FIGS. 1 and 8, first memory device MDEV1 generates first internal clock InCLK1 at a time t1 in a first operation OPER1 for generating a first peak current PCur1. Although first operation OPER1 is completed after a predetermined period of time t2-t1, first memory device MDEV1 may continuously activate first internal clock InCLK1 because first peak current PCur1 is not generated in a second operation OPER2 subsequent to first operation OPER1 but is generated in a third operation OPER3 subsequent to second operation OPER2 as illustrated in FIG. 8.

In FIG. 8, although second operation OPER2, which does not generate first peak current PCur1 (see a first inverted triangle of first internal clock InCLK1 in FIG. 7), is performed as illustrated in FIG. 7, first internal clock InCLK1 is continuously activated and thus peak signal PM is maintained in logic "L". This type of control may be performed by controller CNT of FIG. 1.

If a peak current generation operation needs to be performed again not long after the peak current generation operation is performed, maintaining an authority for performing the peak current generation operation to keep continuity in operation as illustrated in FIG. 8 is more efficient than granting the authority to another memory device and then recovering the authority back, in terms of performance of memory system MSYS.

Although peak current generation periods of first through fourth memory devices MDEV1 through MDEV4 may be set differently according to the type of operation, as illustrated in FIG. 4, the inventive concept is not limited thereto, and the peak current generation periods may be set in various ways. For this purpose, each of the first through fourth memory devices MDEV1 through MDEV4 of memory system MSYS of FIG. 1 further comprises a peak current setting unit PSU for setting the peak current generation periods.

Peak current setting unit PSU may generate a setup signal XPcur comprising information regarding the peak current generation periods and may transmit setup signal XPcur to internal clock generator IGEN. Internal clock generator IGEN may generate internal clock InCLK in synchronization with processor clock PCLK, in response to setup signal XPcur. In the above example where the peak current generation periods are set differently according to the type of operation, internal clock generator IGEN may also generate internal clock InCLK in synchronization with processor clock PCLK, in response to setup signal XPcur.

In the description that follows, examples of different peak current generation periods are described in detail.

In FIG. 6, after a peak current generation operation is completely performed by one memory device at one time, the memory device does not perform any other operation. Also, another memory device performs the peak current generation operation only after the peak current generation operation is completed by one memory device. That is, the peak current generation periods are according to operational units shown in FIG. 2. However, the inventive concept is not limited thereto.

Where the memory device is set to terminate the peak current generation operation (e.g., the program bitline setup operation of FIG. 2) after the peak current generation operation is repeated more than a predetermined number of times, peak current setting unit PSU may not set a corresponding period as the peak current generation period if the peak current generation operation is repeated more than the predetermined number of times.

Figure 9:
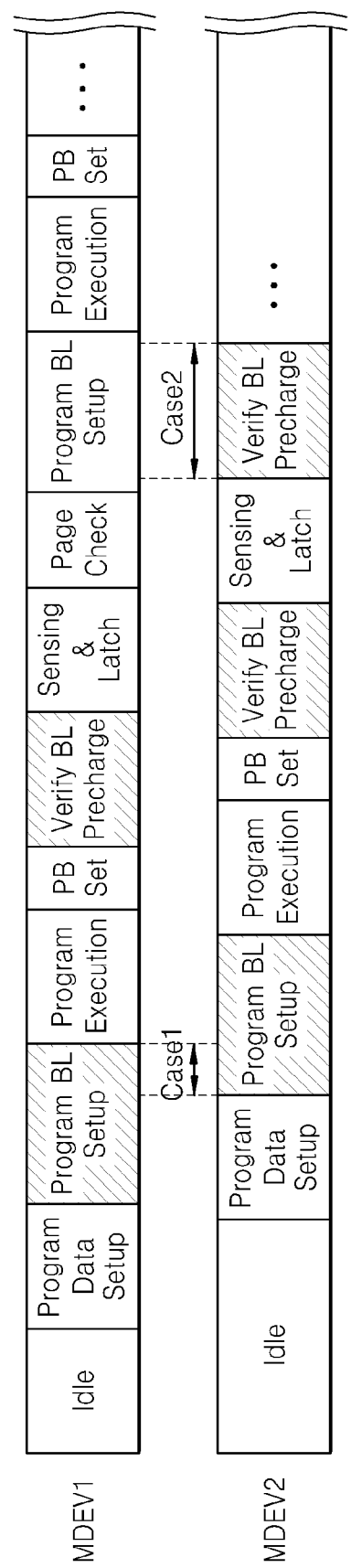
FIG. 9 is a diagram illustrating a method of controlling peak currents of memory devices in the memory system of FIG. 1 according to another embodiment of the inventive concept.
Figure 10A:
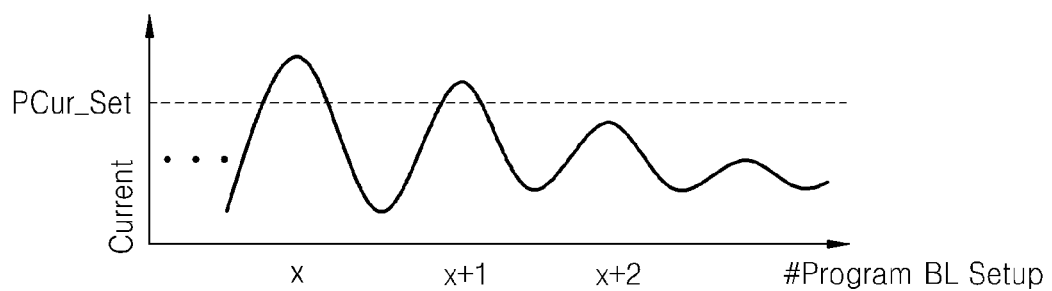
FIGS. 10A and 10B are a graph and a block diagram for describing an operation and a structure of a peak current setting unit in the memory system of FIG. 1 using the method of FIG. 9.

For example, although a program bitline setup period is the peak current generation period as illustrated in FIG. 9, if the number of times that the program bitline setup operation is performed is increased as illustrated in FIG. 10A, the size of a current generated in the program bitline setup period may be reduced. In more detail, because the current generated in the program bitline setup period is greater than a peak current setup value PCur_Set, which is a reference for determining a peak current PCur, until the program bitline setup operation is performed x+1 times, peak current setting unit PSU sets the program bitline setup period as the peak current generation period until the program bitline setup operation is performed x+1 times. However, if the program bitline setup operation is performed more than x+2 times, because the current generated in the program bitline setup period is less than peak current setup value PCur_Set, peak current setting unit PSU does not set the program bitline setup period as the peak current generation period.

Figure 10B:
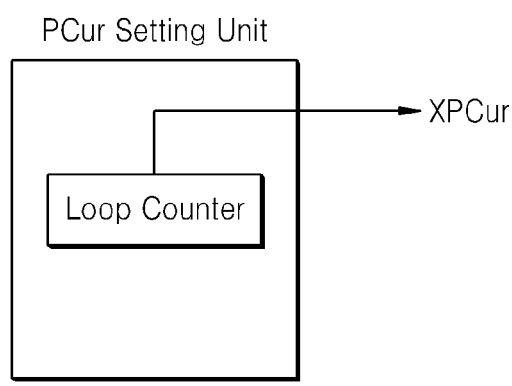

In this case, peak current setting unit PSU comprises a loop counter for counting the number of times that the program bitline setup operation is performed, as illustrated in FIG. 10B. In FIG. 9, if a first program bitline setup operation of first memory device MDEV1 is performed x+1 times and a second program bitline setup operation of first memory device MDEV1 is performed x+2 times, a period for the first program bitline setup operation is set as the peak current generation period and thus first memory device MDEV1 may generate peak current PCur simultaneously with second memory device MDEV2 (Case1). However, a period for the second program bitline setup operation may not be set as the peak current generation period and thus first memory device MDEV1 does not generate peak current PCur simultaneously with second memory device MDEV2 (Case2).

As such, according to an embodiment of the inventive concept, a memory system sets peak current generation periods adaptively according to the characteristics of the memory system, and thus, may efficiently control the generation of peak currents and minimize unnecessary operational delays.

Figure 11A:
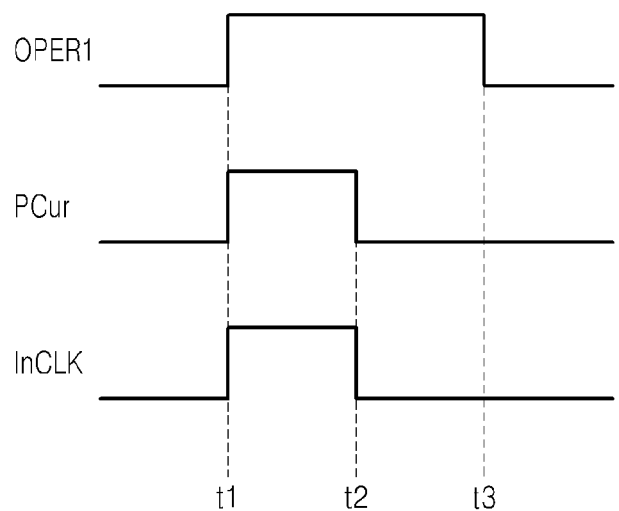
FIGS. 11A and 11B are a timing diagram and a block diagram for describing the method of FIG. 9.
Figure 11B:
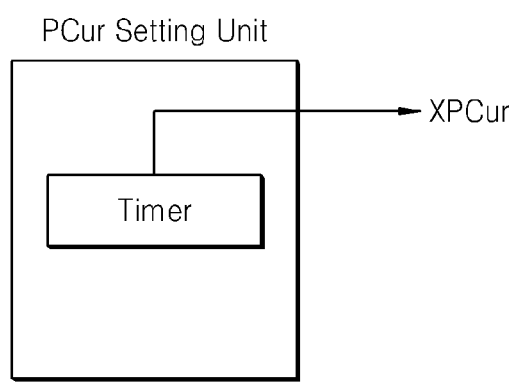

Also, referring to FIGS. 11A and 11B, if peak current PCur is mostly generated in an initial part of the peak current generation operation, peak current setting unit PSU does not set a corresponding period as the peak current generation period after a predetermined time passes since a corresponding operation has been started. In FIG. 11A, if a first operation OPER1 is performed in a period between times t1 and t3 and peak current PCur of first operation OPER1 is generated only between times t1 and t2, internal clock InCLK is activated only between the times t1 and t2. For this, peak current setting unit PSU comprises a timer for counting an elapsed amount of time.

As such, according to an embodiment of the inventive concept, if a peak current is mostly generated in an initial part of an operation, a memory device allows another memory device to perform a peak current generation operation after a predetermined time passes since the operation has been started, and thus, a memory system may efficiently control the generation of peak currents and minimize unnecessary operational delays.

Although first through n-th memory devices MDEV1 through MDEVn of memory system MSYS have the same structure and perform the same operation as the above description, the inventive concept is not limited thereto.

Figure 12:
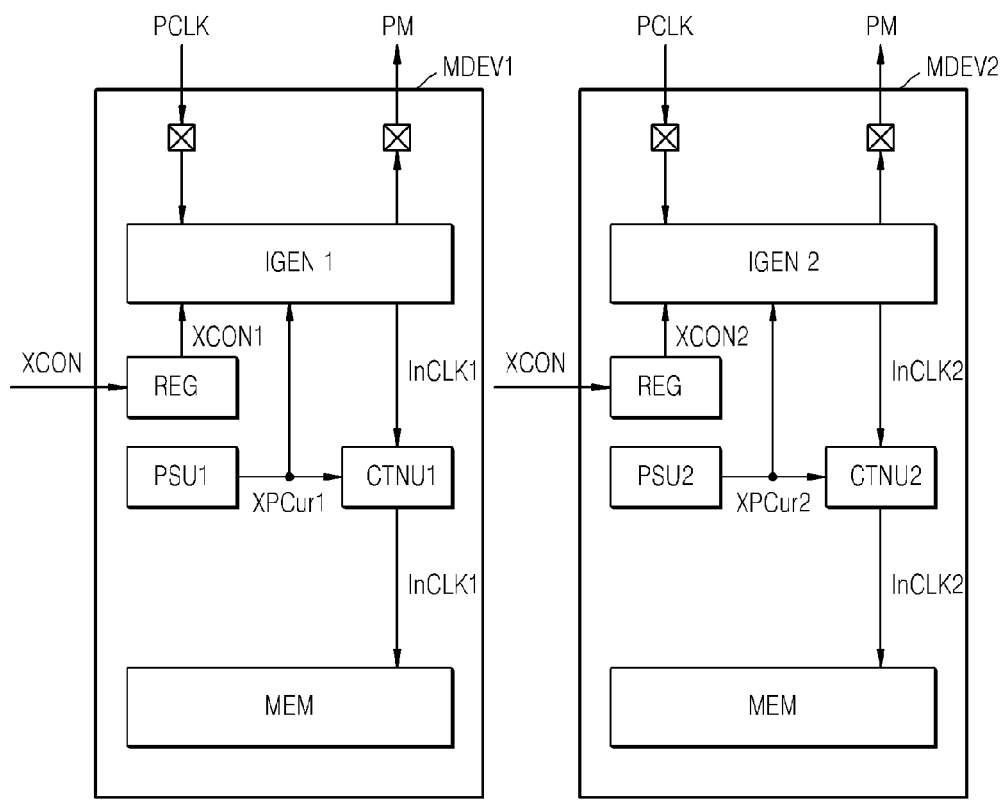
FIG. 12 is a partial block diagram of a memory system comprising memory devices for performing different operations according to another embodiment of the inventive concept.
Figure 13:
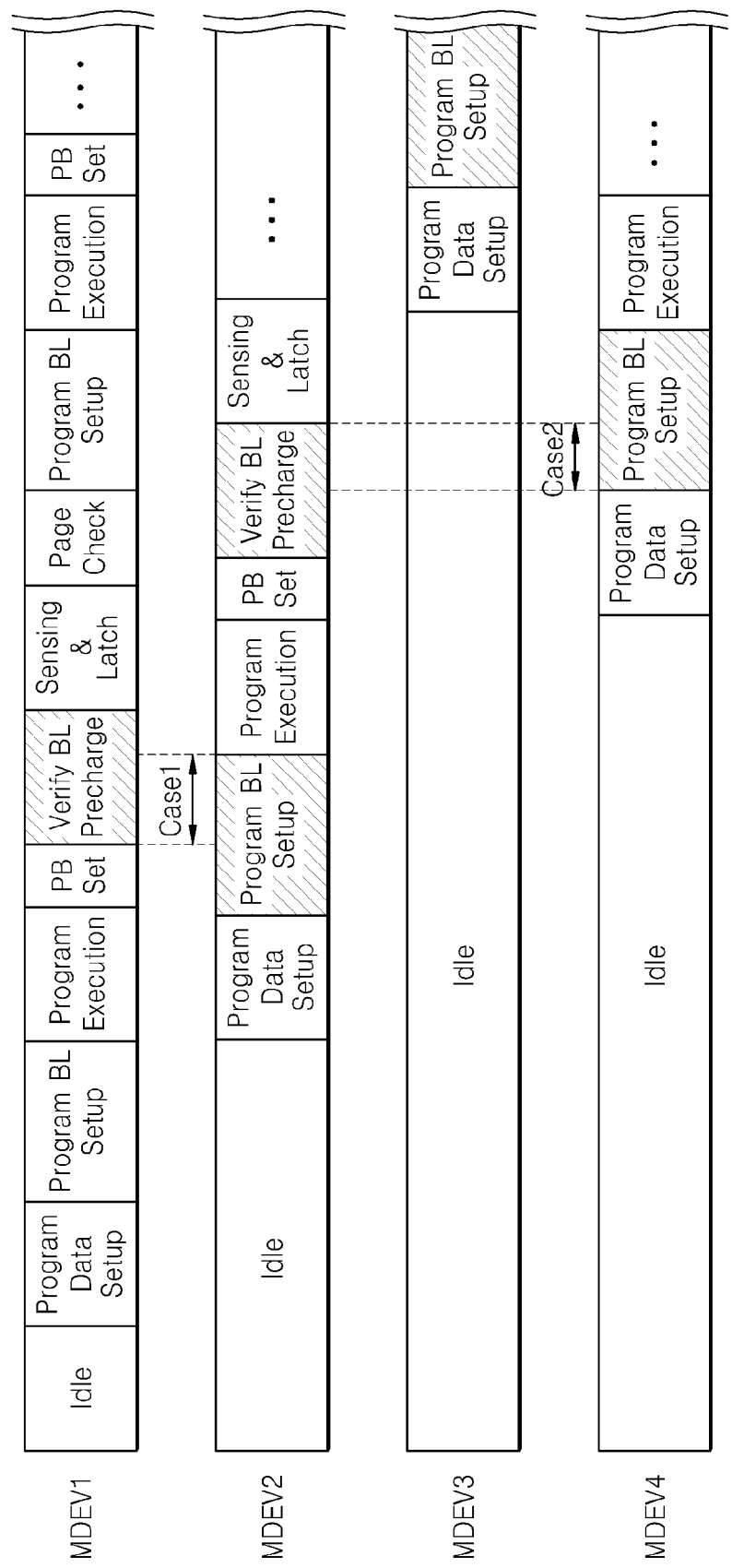
FIG. 13 is a diagram for describing operations of the memory system of FIG. 12.

FIG. 12 is a partial block diagram of a memory system MSYS comprising first through n-th memory devices MDEV1 through MDEVn for performing different operations according to another embodiment of the inventive concept. FIG. 13 is a diagram for describing operations of memory system MSYS of FIG. 12.

Referring to FIGS. 12 and 13, internal clock generators IGEN of first through n-th memory devices MDEV1 through MDEVn in memory system MSYS generate internal clocks InCLK with different settings. That is, first and second peak current setting units PSU1 and PSU2 of first and second memory devices MDEV1 and MDEV2 in memory system MSYS set peak current generation operations differently. For example, as illustrated in FIG. 13, first peak current setting unit PSU1 of first memory device MDEV1 sets only a verification bitline precharge operation as the peak current generation operation. On the other hand, second peak current setting unit PSU2 of second memory device MDEV2 sets both of a program bitline setup operation and a verification bitline precharge operation as the peak current generation operations. Furthermore, as described above in relation to FIGS. 10A and 10B, and 11A and 11B, first and second memory devices MDEV1 and MDEV2 of memory system MSYS also set the peak current generation operations differently according to the number of times that an operation is repeated, and a time that passed since the operation has been started.

Each of first and second memory devices MDEV1 and MDEV2 further comprises a register REG for storing control information XCON received from controller CNT. In this case, controller CNT of first and second memory devices MDEV1 and MDEV2 transmits different types of control information XCON (XCON1 and XCON2). For example, controller CNT can transmit different types of control information XCON having different delay values with respect to same processor clock PCLK such that first and second memory devices MDEV1 and MDEV2 generate respective first and second internal clocks InCLK1 and InCLK2 having different delays. Alternatively, control information XCON1 and XCON2 may be set differently according to operational characteristics (e.g., operation speeds) of first and second memory devices MDEV1 and MDEV2. Control information XCON1 and XCON2 stored in registers REG is transmitted to first and second internal clock generators IGEN1 and IGEN2, and first and second internal clock generators IGEN1 and IGEN2 generate first and second internal clocks InCLK1 and InCLK2 according to respective control information XCON1 and XCON2 with respect to same processor clock PCLK. For example, if the operating speed of first memory device MDEV1 is higher than the operating speed of second memory device MDEV2, a cycle of first internal clock InCLK1 of first memory device MDEV1 may be shorter than the cycle of second internal clock InCLK2 of second memory device MDEV2.

In the above-described embodiments, controller CNT monitors peak signal PM (e.g., PM Monitoring in FIG. 6) to control whether to apply processor clock PCLK to first through fourth memory devices MDEV1 through MDEV4 (whether to generate internal clocks InCLK). However, first through fourth internal clocks InCLK1 through InCLK4 of first through fourth memory devices MDEV1 through MDEV4 may also be generated regardless of peak signal PM, as described as follows.

Figure 14A:
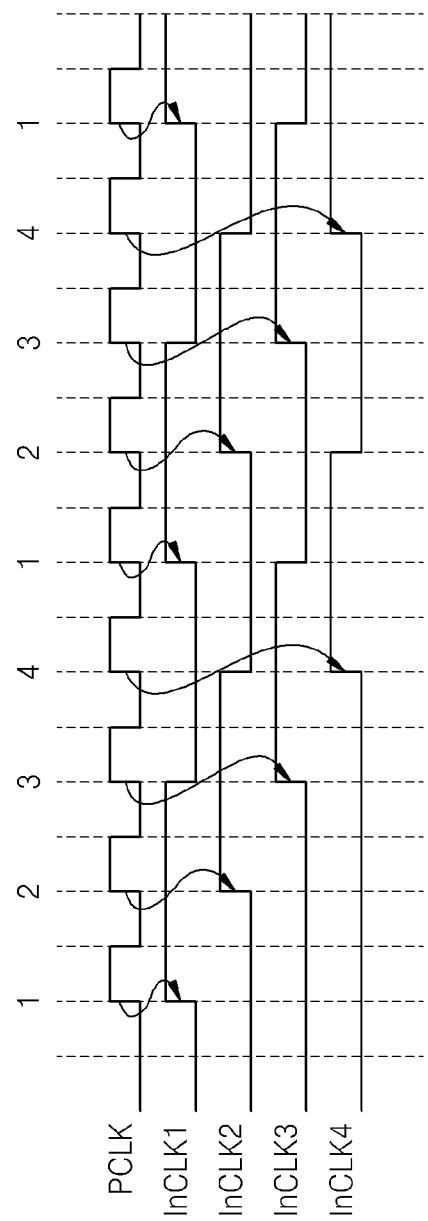
FIGS. 14A and 14B are timing diagrams for describing a method of controlling peak currents between memory devices in the memory system of FIG. 1 according to other embodiments of the inventive concept.
Figure 14B:
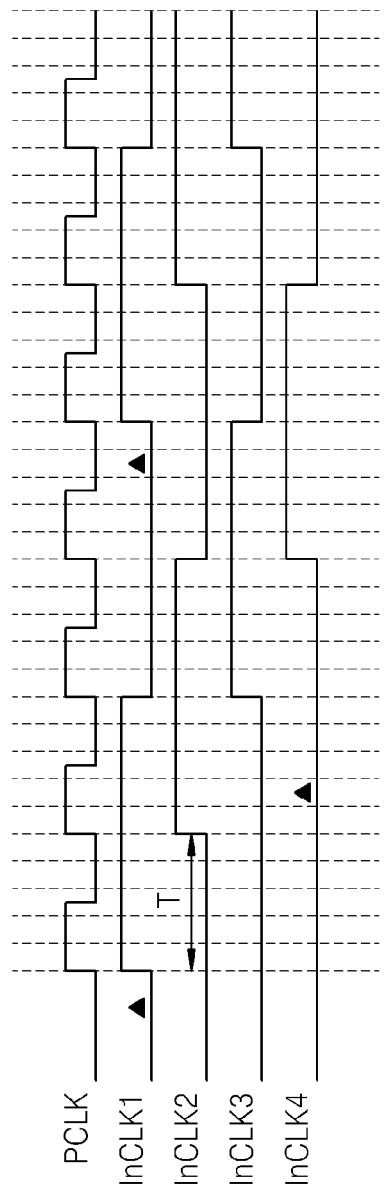

FIGS. 14A and 14B are timing diagrams for describing a method of controlling peak currents PCur between first through n-th memory devices MDEV1 through MDEVn in memory system MSYS of FIG. 1 according to other embodiments of the inventive concept.

Referring to FIGS. 12 and 14A, each of first through fourth memory devices MDEV1 through MDEV4 can be represented using a unique identifier. Where memory system MSYS is powered on, controller CNT receives information regarding the identifier of each of first through fourth memory devices MDEV1 through MDEV4, and it identifies first through fourth memory devices MDEV1 through MDEV4. For example, as illustrated in FIG. 14A, first memory device MDEV1 is recognized using an identifier "1", second memory device MDEV2 is recognized using an identifier "2", third memory device MDEV3 is recognized using an identifier "3", and fourth memory device MDEV4 is recognized using an identifier "4". First through fourth memory devices MDEV1 through MDEV4 generate respective first through fourth internal clocks InCLK1 through InCLK4 in synchronization with edges of processor clock PCLK corresponding to their identifiers.

As such, memory system MSYS can authorize peak current generation operations equally to all memory devices instead of providing authorization according to fixed priorities assigned to the memory devices. In general, if fixed priorities are assigned to memory devices, because high-priority memory devices preferentially perform the peak current generation operations, low-priority memory devices may not perform the peak current generation operations. Furthermore, in some cases, the low-priority memory devices may not perform the peak current generation operations even when the high-priority memory devices do not perform the peak current generation operations.

Referring to FIGS. 12 and 14B, first through fourth memory devices MDEV1 through MDEV4 generate respective first through fourth internal clocks InCLK1 through InCLK4 in a time cycle T. For example, second internal clock InCLK2 is activated after time cycle T since first internal clock InCLK1 has been activated. Similarly, third internal clock InCLK3 is activated after time cycle T since second internal clock InCLK2 has been activated, and fourth internal clock InCLK4 is activated after time cycle T since third internal clock InCLK3 has been activated. In this case, time cycle T is set in correspondence with one of various peak current generation operations described above. That is, processor clock PCLK is generated in time cycle T, first through fourth memory devices MDEV1 through MDEV4 are sequentially activated at edges of processor clock PCLK, and thus, the peak current generation operations do not overlap each other without additionally using peak signal PM.

Figure 15:
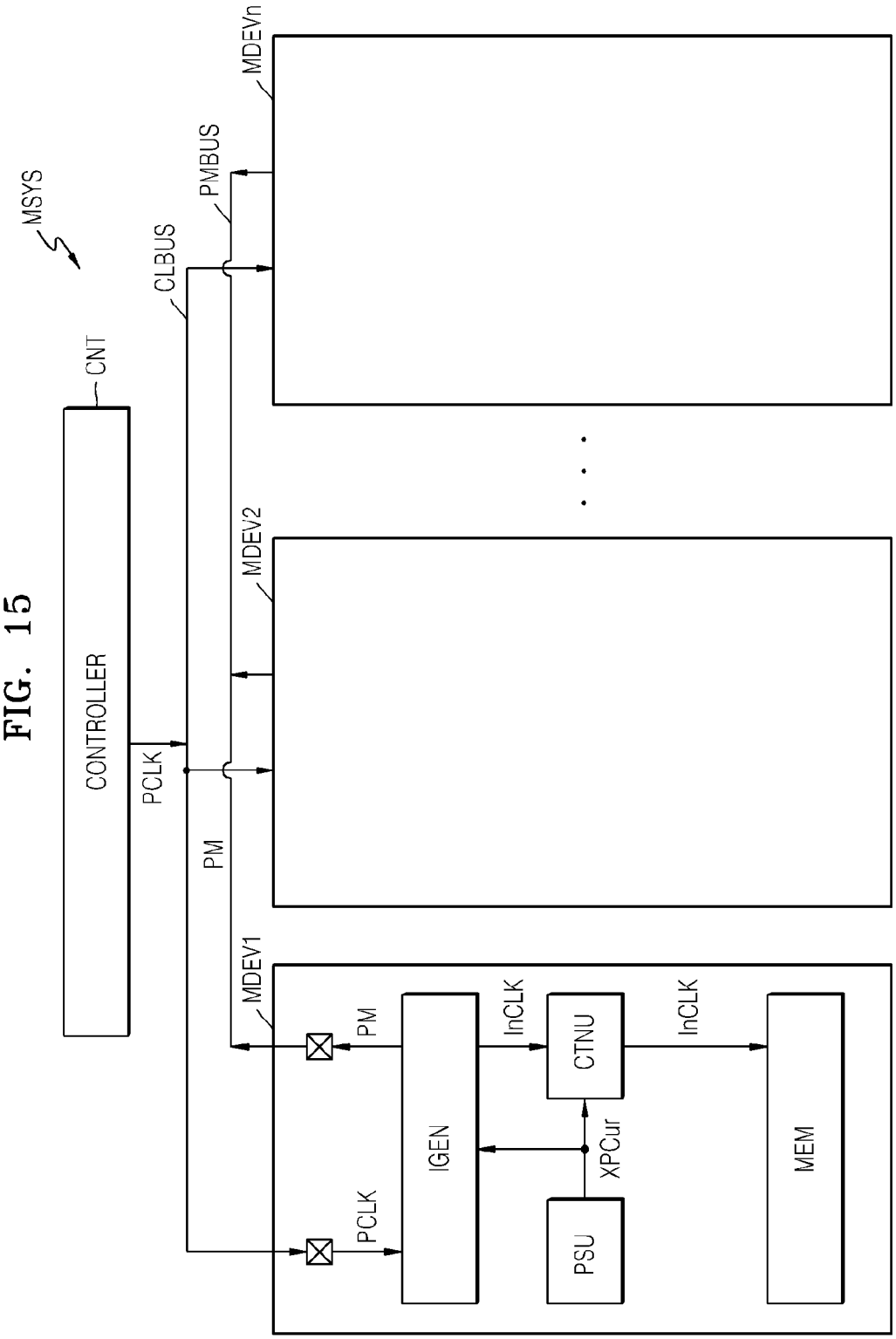
FIG. 15 is a block diagram of a memory system according to another embodiment of the inventive concept.
Figure 16:
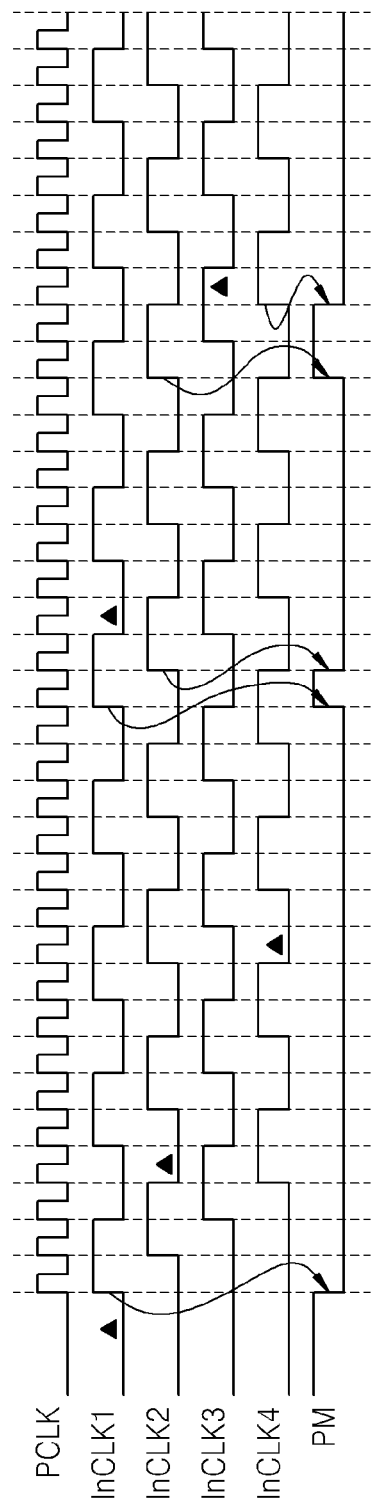
FIG. 16 is a timing diagram illustrating a method of controlling peak currents in the memory system of FIG. 15.

FIG. 15 is a block diagram of memory system MSYS according to another embodiment of the inventive concept. FIG. 16 is a timing diagram illustrating a method of controlling peak currents PCur in memory system MSYS of FIG. 15.

Referring to FIG. 15, unlike memory system MSYS of FIG. 1, in memory system MSYS of FIG. 15, peak signal PM controlled by first through n-th memory devices MDEV1 through MDEVn is not transmitted to controller CNT. Each of first through n-th memory devices MDEV1 through MDEVn determines whether to start a peak current generation operation by monitoring whether other memory devices perform the peak current generation operation based on a voltage level of peak signal PM via peak signal bus PMBUS connected between first through n-th memory devices MDEV1 through MDEVn. To accomplish this, first through n-th memory devices MDEV1 through MDEVn sequentially generate internal clocks InCLK in synchronization with processor clock PCLK. For example, as illustrated in FIG. 16, first internal clock InCLK1, second internal clock InCLK2, third internal clock InCLK3, and fourth internal clock InCLK4 are generated sequentially.

Figure 17:
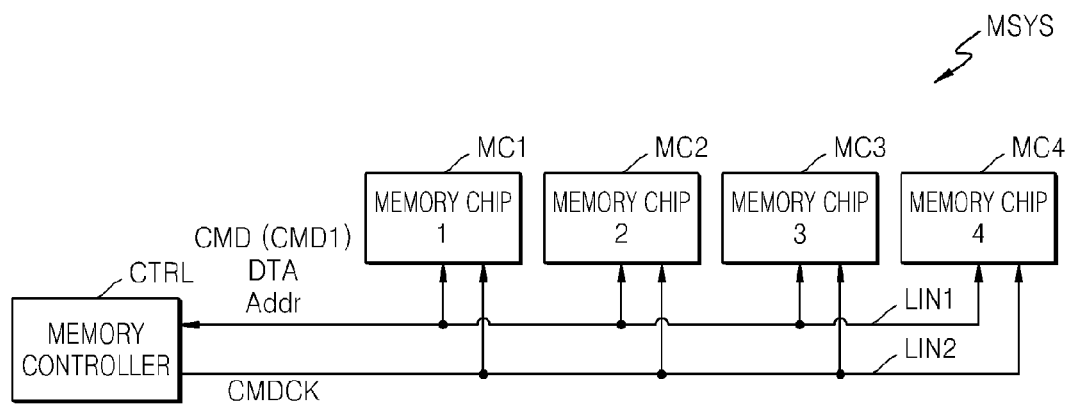
FIG. 17 is a block diagram of a memory system according to another embodiment of the inventive concept.

FIG. 17 is a block diagram of a memory system MSYS according to another embodiment of the inventive concept.

Referring to FIG. 17, memory system MSYS comprises a memory controller CTRL and first through fourth NAND flash memory chips MC1 through MC4. Memory controller CTRL transmits a command CMD and data DTA to control first through fourth NAND flash memory chips MC1 through MC4. For example, memory controller CTRL may transmit a program command and data to a corresponding NAND flash memory chip. Also, memory controller CTRL can receive data DTA corresponding to a command CMD from first through fourth NAND flash memory chips MC1 through MC4. For example, memory controller CTRL may transmit a read command to a corresponding NAND flash memory chip, and may read data programmed in the NAND flash memory chip. In this example, command CMD includes an address Addr for programming or reading data DTA. Alternatively, address Addr may be transmitted and received separately from command CMD.

Memory system MSYS comprises a first transmission line LIN1 for transmitting or receiving command CMD and data DTA, between memory controller CTRL and first through fourth NAND flash memory chips MC1 through MC4. First transmission line LIN1 of FIG. 17 may be a bus for transmitting or receiving command CMD and data DTA. Although only one transmission line (first transmission line LIN1) for command CMD and data DTA is illustrated in FIG. 17, a first transmission line LIN1 for command CMD and a first transmission line LIN1 for data DTA may be separately included. Also, as described above, if address Addr is transmitted and received separately from command CMD, a first transmission line LIN1 for address Addr may be additionally included.

In the example of FIG. 17, memory system MSYS comprises four NAND flash memory chips, although it is not restricted to this number. Nevertheless, for convenience of explanation, an example will be described in which memory system MSYS includes first through fourth NAND flash memory chips MC1 through MC4.

First through fourth NAND flash memory chips MC1 through MC4 receive command CMD, data DTA, and/or address Addr from memory controller CTRL via first transmission line LIN1, and they execute corresponding operations. Where command CMD is a program command, first through fourth NAND flash memory chips MC1 through MC4 program data DTA in address Addr. Also, where command CMD is a read command, first through fourth NAND flash memory chips MC1 through MC4 read data DTA from address Addr, and they transmit data DTA to memory controller CTRL.

However, where first through fourth NAND flash memory chips MC1 through MC4 execute an operation corresponding to command CMD, according to type of command CMD or the type of sub-operations indicated by command CMD, a corresponding NAND flash memory chip may generate a peak current. For example, first through fourth NAND flash memory chips MC1 through MC4 may generate a peak current when a program command is executed. Alternatively, if the program command indicates sub-operations such as a program operation and a verification operation, first through fourth NAND flash memory chips MC1 through MC4 may generate a peak current only when the program operation is executed. Hereinafter, for convenience of explanation, from among commands CMD transmitted from memory controller CTRL and executed by first through fourth NAND flash memory chips MC1 through MC4, a command for generating a peak current is referred to as a first command CMD1.

In a memory system comprising a plurality of memory chips, where peak currents are generated by some or all of the memory chips, i.e., where commands for generating peak currents are simultaneously executed in a plurality of memory chips, a peak current beyond a system-manageable level may flow through the memory system. Where a very large peak current temporarily occurs in the memory system, the memory system may be powered off. As such, data may be misprogrammed or misread. Accordingly, the reliability of the memory system may be reduced. However, memory system MSYS according to the current embodiment prevents malfunction or reduction of reliability by controlling generation of peak currents in first through fourth NAND flash memory chips MC1 through MC4.

Figure 18:
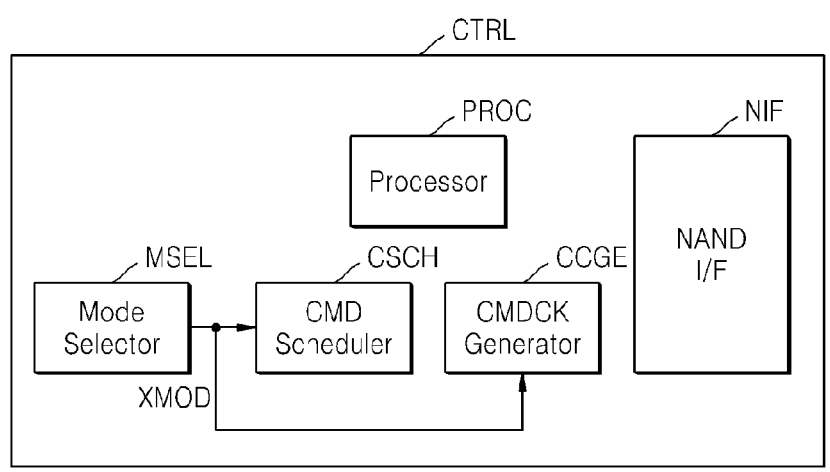
FIG. 18 is a block diagram of a memory controller shown in FIG. 17.

FIG. 18 is a block diagram of memory controller CTRL of FIG. 17.

Referring to FIGS. 17 and 18, memory controller CTRL comprises a processor PROC, a NAND interface NIF, a command clock generator CCGE, and a command scheduler CSCH. Processor PROC controls other elements of memory controller CTRL. For example, processor PROC may control signal transmission and reception between or operation periods of command clock generator CCGE, command scheduler CSCH, and NAND interface NIF. NAND interface NIF transmits and receives a signal (data, a command, a clock, etc.) between memory controller CTRL and first through fourth NAND flash memory chips MC1 through MC4.

Figure 24A:
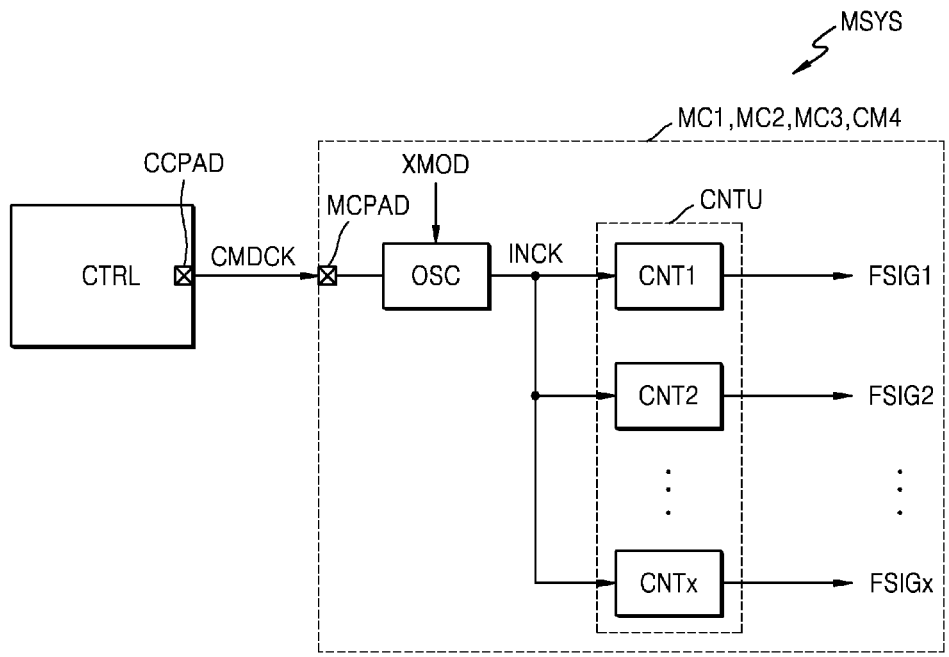
FIGS. 24A and 24B are diagrams for describing a structure and operations for executing a first command in each NAND flash memory chip of FIG. 17.
Figure 24B:
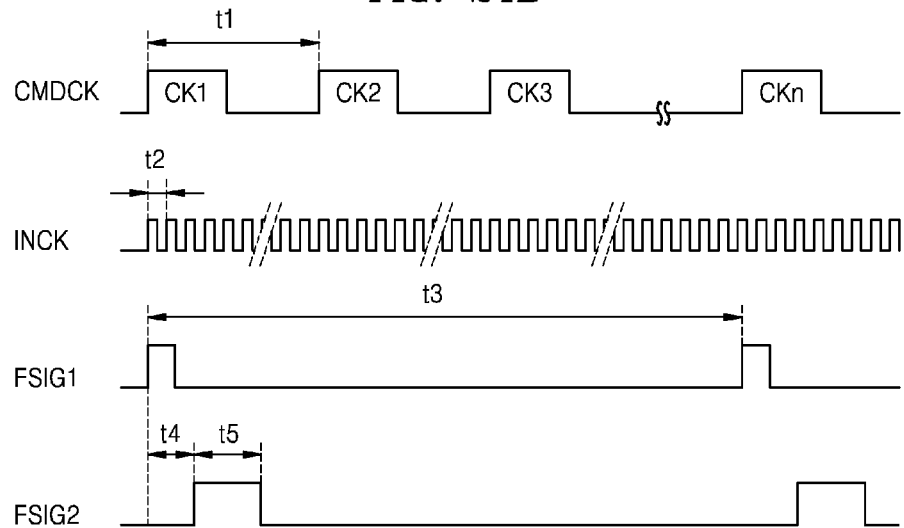

Command clock generator CCGE generates a command clock CMDCK. Command clock CMDCK can be used as a reference when first command CMD1 is applied from memory controller CTRL to first through fourth NAND flash memory chips MC1 through MC4. For example, as will be described below, first command CMD1 may be transmitted in synchronization with command clock CMDCK. Command clock CMDCK is applied to first through fourth NAND flash memory chips MC1 through MC4 via a second transmission line LIN2, which is separate from the above-described first transmission line LIN1. To allow first through fourth NAND flash memory chips MC1 through MC4 to execute first command CMD1 in synchronization with received command clock CMDCK, an internal clock INCK and first through x-th flag signals FSIG1 through FSIGx are generated as illustrated in FIGS. 24A and 24B. Internal clock INCK and first through x-th flag signals FSIG1 through FSIGx are described in further detail below.

Figure 19:
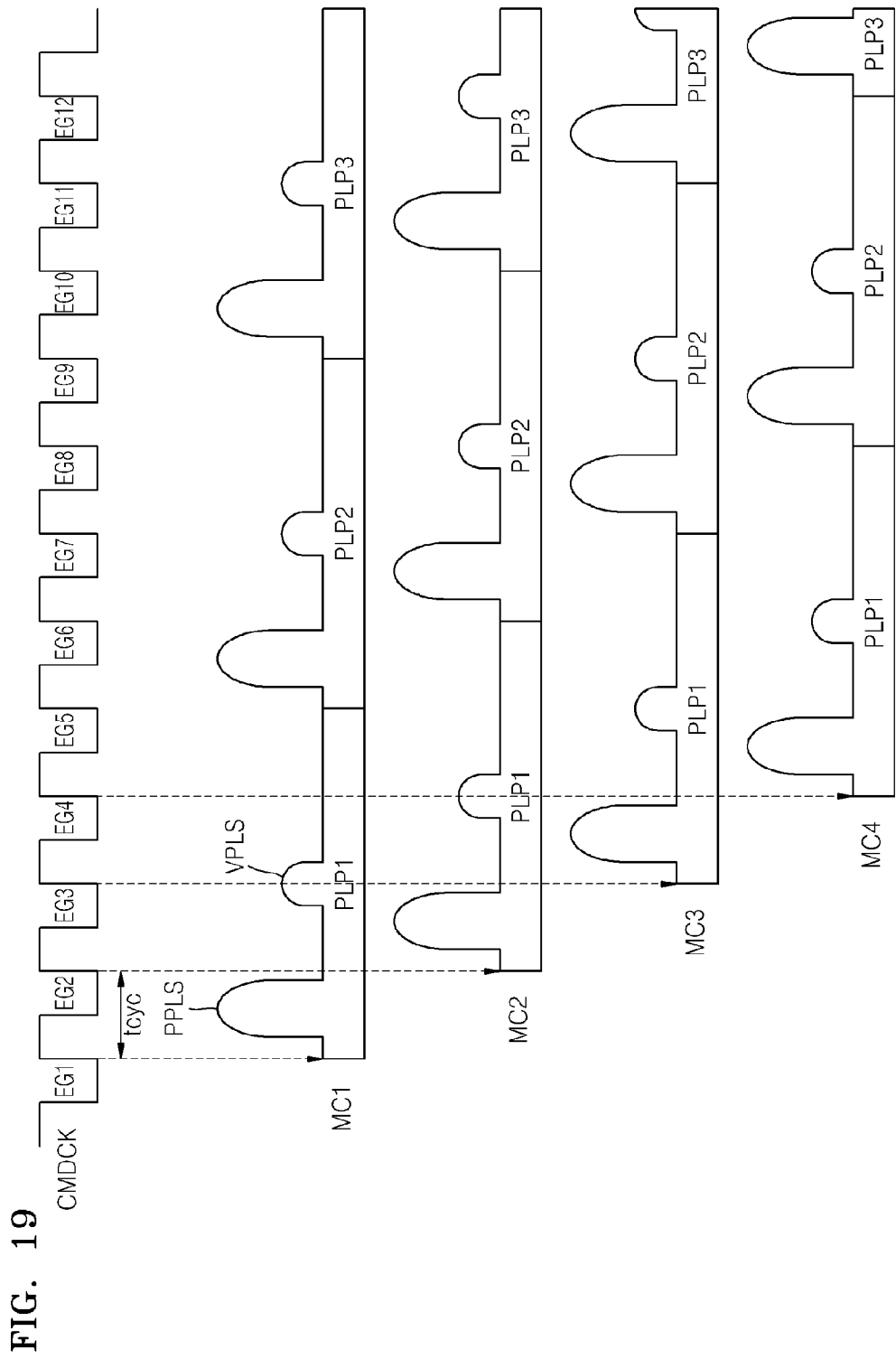
FIG. 19 is a diagram illustrating an operation of executing a first command in synchronization with a command clock in each NAND flash memory chip of FIG. 17.

Referring again to FIGS. 17 and 18, in a first mode, command scheduler CSCH controls first command CMD1 to be applied to a corresponding NAND flash memory chip in synchronization with command clock CMDCK. For example, as illustrated in FIG. 19, command scheduler CSCH controls first command CMD1 to be transmitted to first NAND flash memory chip MC1 at a first edge EG1 of command clock CMDCK. Also, command scheduler CSCH controls first command CMD1 to be transmitted to second NAND flash memory chip MC2 at a second edge EG2 of command clock CMDCK. Likewise, command scheduler CSCH controls first command CMD1 to be transmitted to third and fourth NAND flash memory chips MC3 and MC4 at third and fourth edges EG3 and EG4 of command clock CMDCK, respectively. Where memory system MSYS comprises first through fourth NAND flash memory chips MC1 through MC4 as illustrated in FIG. 17, first command CMD1 may be sequentially transmitted to first through fourth NAND flash memory chips MC1 through MC4 at first through fourth edges EG1 through EG4 of command clock CMDCK. Also, first command CMD1 may be transmitted to first NAND flash memory chip MC1 again at a fifth edge EG5 of command clock CMDCK. In this manner, first command CMD1 is transmitted to second through fourth NAND flash memory chips MC2 through MC4 again at sixth through eighth edges EG6 through EG8 of command clock CMDCK, respectively.

Figure 20:
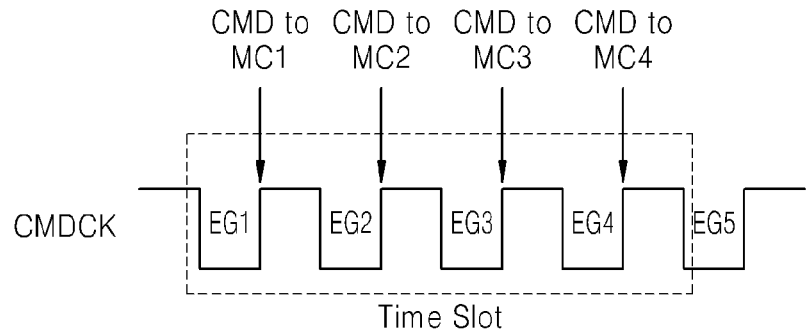
FIG. 20 is a timing diagram for explaining operations of the memory controller of FIG. 17.

That is, as illustrated in FIG. 20, first command CMD1 is applied to first NAND flash memory chip MC1 at first edge EG1 of command clock CMDCK, and to second NAND flash memory chip MC2 at second edge EG2 of command clock CMDCK. Likewise, first command CMD1 is applied to third NAND flash memory chip MC3 at third edge EG3 of command clock CMDCK, and to fourth NAND flash memory chip MC4 at fourth edge EG4 of command clock CMDCK.

Referring again to FIG. 19, a cycle tcyc of command clock CMDCK corresponds to a peak current generation period of first command CMD1. It can be set as a period extending from activation to deactivation of a program pulse PPLS. For example, the cycle tcyc of command clock CMDCK can be set as a period after first program loop PLP1 of first NAND flash memory chip MC1 is activated until program pulse PPLS of first program loop PLP1 is inactivated.

As such, command scheduler CSCH prevents first command CMD1 from being simultaneously executed in a plurality of NAND flash memory chips, by controlling first command CMD1 to be applied to a corresponding NAND flash memory chip only at a corresponding edge of command clock CMDCK. In other words, if first command CMD1 is transmitted to a corresponding NAND flash memory chip at each edge of command clock CMDCK, because first command CMD1 is not simultaneously transmitted to a plurality of NAND flash memory chips at the same edge, peak currents generated by the NAND flash memory chips may not overlap each other. However, because overlapping of peak currents within a system-manageable level is allowed, first command CMD1 may be transmitted to two or more memory chips at each edge of command clock CMDCK. Detailed descriptions thereof will be provided later.

Referring again to FIGS. 17 and 18, memory controller CTRL further comprises a mode selector MSEL. Mode selector MSEL generates a mode signal XMOD indicating whether to allow some or all of first through fourth NAND flash memory chips MC1 through MC4 to execute first command CMD1 in synchronization with command clock CMDCK, i.e., whether to operate them in the first mode. Memory system MSYS sets NAND flash memory chips or number of NAND flash memory chips to operate in the first mode, based on a system-manageable size of peak currents, the size of a peak current generated by each NAND flash memory chip, and operational characteristics of each NAND flash memory chip.

Mode signal XMOD is transmitted to command clock generator CCGE and command scheduler CSCH. Command clock generator CCGE sets a part of command clock CMDCK as a first period in response to mode signal XMOD. In this case, as illustrated in FIG. 20, the first period is referred to as a time slot. Command clock generator CCGE sets the number of clocks in the time slot, as number of NAND flash memory chips that operate in the first mode.

FIG. 20 shows an example of a time slot where all of first through fourth NAND flash memory chips MC1 through MC4 in memory system MSYS of FIG. 17 are set to operate in the first mode. That is, the number of clocks in the time slot is set to four. As described above, command scheduler CSCH in memory controller CTRL of FIG. 18 controls first command CMD1 to be transmitted to corresponding NAND flash memory chips at edges of the four clocks in the time slot.

Figure 21A:
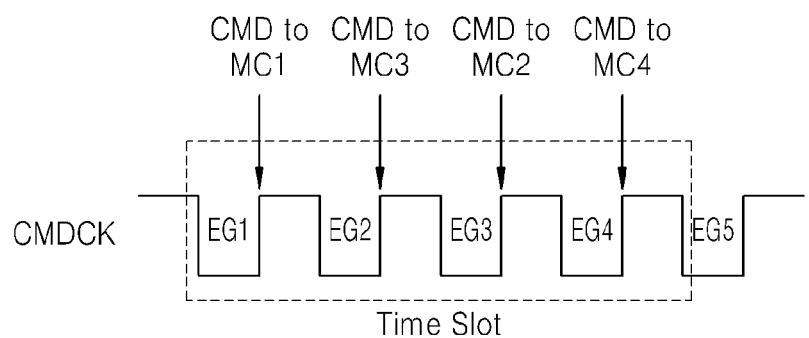
FIGS. 21A and 21B are diagrams showing examples of command scheduling in correspondence with a command clock shown in FIG. 20.

Although edges of command clock CMDCK are sequentially allocated to first through fourth NAND flash memory chips MC1 through MC4 in FIG. 20, the inventive concept is not limited thereto. For example, as illustrated in FIG. 21A, first NAND flash memory chip MC1 may be allocated to first edge EG1 of command clock CMDCK, third NAND flash memory chip MC3 may be allocated to second edge EG2, and second NAND flash memory chip MC2 may be allocated to third edge EG3. Also, fourth NAND flash memory chip MC4 may be allocated to fourth edge EG4 of command clock CMDCK.

Figure 21B:
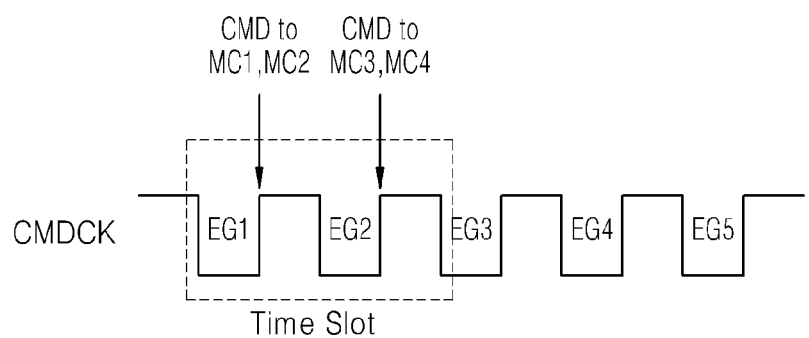

Furthermore, although one NAND flash memory chip is allocated to each edge of command clock CMDCK in FIG. 20, as illustrated in FIG. 21B, two NAND flash memory chips may be allocated to one edge of command clock CMDCK. For example, first and second NAND flash memory chips MC1 and MC2 may be allocated to first edge EG1, and third and fourth NAND flash memory chips MC3 and MC4 may be allocated to second edge EG2. In this case, the number of clocks in the time slot of command clock CMDCK may differ.

As such, first command CMD1 may be transmitted to two NAND flash memory chips at one edge because memory system MSYS may manage peak currents generated by two NAND flash memory chips. Accordingly, number of NAND flash memory chips to which first command CMD1 is transmitted in synchronization with one edge may be differently set according to the performance of memory system MSYS.

Figure 22:
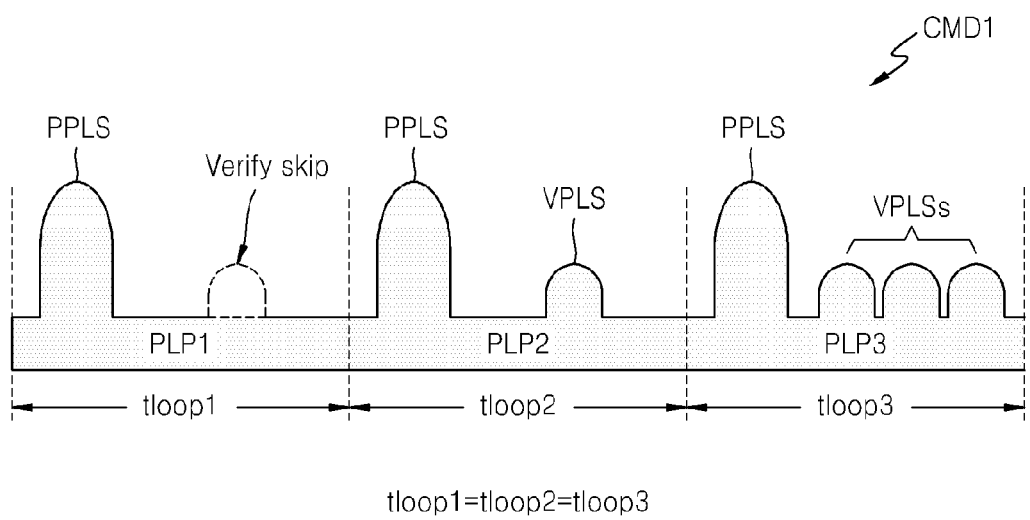
FIG. 22 is a diagram showing loops executed in each NAND flash memory chip of FIG. 17.

FIG. 22 is a diagram showing an example of first command CMD1 executed in each of first through fourth NAND flash memory chips MC1 through MC4 of FIG. 17.

Referring to FIGS. 17 and 22, first command CMD1 transmitted in synchronization with command clock CMDCK may be executed as a plurality of loops in a NAND flash memory chip. For example, if first command CMD1 is a program command, as illustrated in FIG. 22, the program command may be executed as the first through third program loops PLP1 through PLP3 in a NAND flash memory chip.

In FIG. 22, all of the loops have the same execution period. For example, in FIG. 22, an execution period tloop1 of first program loop PLP1 is the same as an execution period tloop2 of second program loop PLP2. Likewise, the execution period tloop2 of second program loop PLP2 is the same as an execution period tloop3 of third program loop PLP3. In addition, the loops in FIG. 22 have the same operation or execution period in every NAND flash memory chip that operates in the first mode from among first through fourth NAND flash memory chips MC1 through MC4 of FIG. 17.

Regardless of the number of pulses in each loop, execution periods of the loops may be the same (tloop1=tloop2=tloop3). For example, in FIG. 22, first program loop PLP1 comprises only a program pulse PPLS because an operation for verifying program pulse PPLS is skipped in first program loop PLP1. On the other hand, second program loop PLP2 comprises a program pulse PPLS and a verification pulse VPLS. Furthermore, third program loop PLP3 comprises one program pulse PPLS and three verification pulses VPLSs.

Even where different numbers of pulses are included, loops of first command CMD1 have the same execution period. Memory system MSYS may optimize operational characteristics by skipping a verification operation to minimize current consumption or by enhancing the verification operation to improve reliability, and may easily control overlapping of peak currents between NAND flash memory chips by executing each loop in a fixed period.

Figure 23:
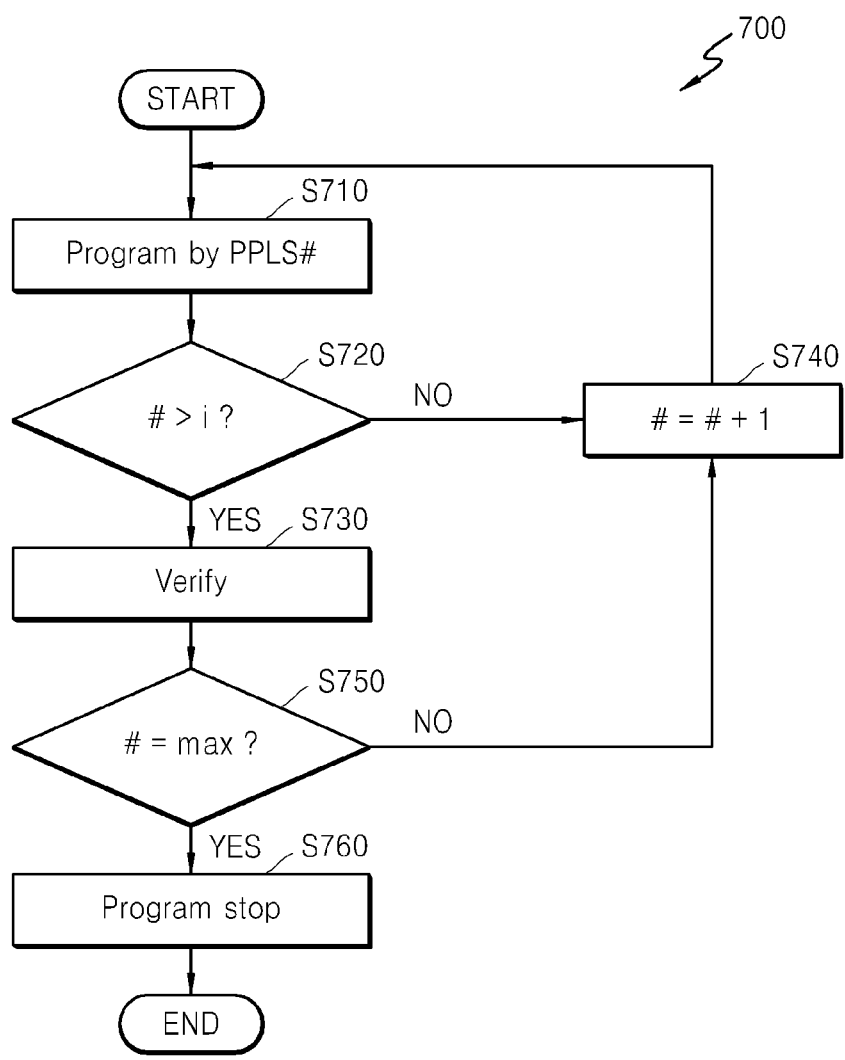
FIG. 23 is a flowchart illustrating a program method performed in the memory system of FIG. 17.

FIG. 23 is a flowchart illustrating a program method 700 performed in memory system MSYS of FIG. 17.

Referring to FIGS. 17 and 23, program method 700 is performed using a plurality of program pulses having sequentially increasing voltage levels. In other words, it is performed using incremental step pulse programming (ISPP). Each of first through fourth NAND flash memory chips MC1 through MC4 receives a program command and performs a program operation with a program pulse PPLS# (S710). Accordingly, where the program command is executed using program method 700, a plurality of program loops comprising program pulses as illustrated in FIG. 22 may be executed.

However, according to program method 700, an operation of verifying initial i program pulses (i is a natural number) of the ISPP may be skipped. In more detail, the method determines whether a corresponding program pulse PPLS# is subsequent to an i-th program pulse, i.e., whether program pulse PPLS# is an (i+1)th or subsequent program pulse of the ISPP (S720). If so (S720=Yes), a program result obtained by program pulse PPLS# is verified (S730). On the other hand, if a corresponding loop loop# is an i-th or prior loop (S720=No), the program result obtained by program pulse PPLS# is not verified and a subsequent program loop (#=#+1) is executed (S740). Accordingly, as in first program loop PLP1 of FIG. 22, a verification operation is skipped.

An operation of verifying a program result obtained by predetermined program pulses is skipped because an initial predetermined number of program pulses from among program pulses of ISPP may obviously fail in programming. In program method 700, in order to reduce current consumption, a verification operation may be skipped on an initial predetermined number of program pulses of ISPP, which are determined based on tests, etc. to obviously fail in programming.

After that, the program operation is repeated by program pulses prior to a final program pulse of the ISPP (#≠max) ("NO" in operation S750). However, if the program operation is performed by the final program pulse of the ISPP (S750=Yes), because the program operation is terminated regardless of a failure of its program result (S760), an operation of verifying a program result obtained by a corresponding program pulse may be skipped.

FIGS. 24A and 24B are diagrams for describing the structure and operation for executing first command CMD1 in each of first through fourth NAND flash memory chips MC1 through MC4 of FIG. 17.

Referring to FIGS. 17 and 24A, each of first through fourth NAND flash memory chips MC1 through MC4 comprises an oscillator OSC for generating internal clock INCK activated in response to command clock CMDCK in the first mode, and a counter unit CNTU for generating first through x-th flag signals FSIG1 through FSIGx in synchronization with internal clock INCK. In this case, first through fourth NAND flash memory chips MC1 through MC4 receive command clock CMDCK via a command clock pad MCPAD. For reference, memory controller CTRL may output command clock CMDCK via a command clock pad CCPAD.

Oscillator OSC operates in response to mode signal XMOD, which is generated by mode selector MSEL of FIG. 18 and is transmitted to a corresponding NAND flash memory chip together with or separate from first command CMD1. Alternatively, mode signal XMOD can be generated in first through fourth NAND flash memory chips MC1 through MC4 when command clock CMDCK is applied to command clock pad MCPAD of first through fourth NAND flash memory chips MC1 through MC4, and it may enable oscillator OSC. Furthermore, mode signal XMOD can be controlled to enable oscillator OSC only while first command CMD1 is being executed.

Counter unit CNTU comprises first through x-th counters CNT1 through CNTx. First through x-th counters CNT1 through CNTx respectively generate the first through x-th flag signals FSIG1 through FSIGx. First through x-th flag signals FSIG1 through FSIGx generated by first through x-th counters CNT1 through CNTx set the operation period of loops of FIG. 22.

For example, as illustrated in FIG. 24B, if command clock CMDCK is received in a cycle t1, internal clock INCK may be generated in a cycle t2. First counter CNT1 of counter unit CNTU generates first flag signal FSIG1 having a cycle t3 in synchronization with internal clock INCK. Cycle t3 of first flag signal FSIG1 may be the operation period that is set the same with respect to loops of FIG. 22 (tloop1=tloop2=tloop3). In this case, cycle t3 of first flag signal FSIG1 corresponds to the number of clocks in time slot of FIG. 20. That is, an operation period of each loop (for example, tloop1 in FIG. 22) may correspond to number of NAND flash memory chips that operate in the first mode. For example, number of clocks CK1 through CKn of command clock CMDCK in the cycle t3 of first flag signal FSIG1 (i.e., n−1) may be same as number of NAND flash memory chips that operate in the first mode.

Second counter CNT2 of counter unit CNTU generates second flag signal FSIG2, which is delayed from internal clock INCK by a period t4 and activated for a period t5. Due to second flag signal FSIG2, in each of loops of FIG. 22, program pulse PPLS is delayed by period t4 after the loops are activated, and may be activated for period t5.

Although not shown in FIG. 24B, a predetermined counter of counter unit CNTU of FIG. 24A may generate a flag signal indicating a time and period when verification pulse VPLS is activated after program pulse PPLS is inactivated, in second program loop PLP2 of FIG. 22.

Figure 25:
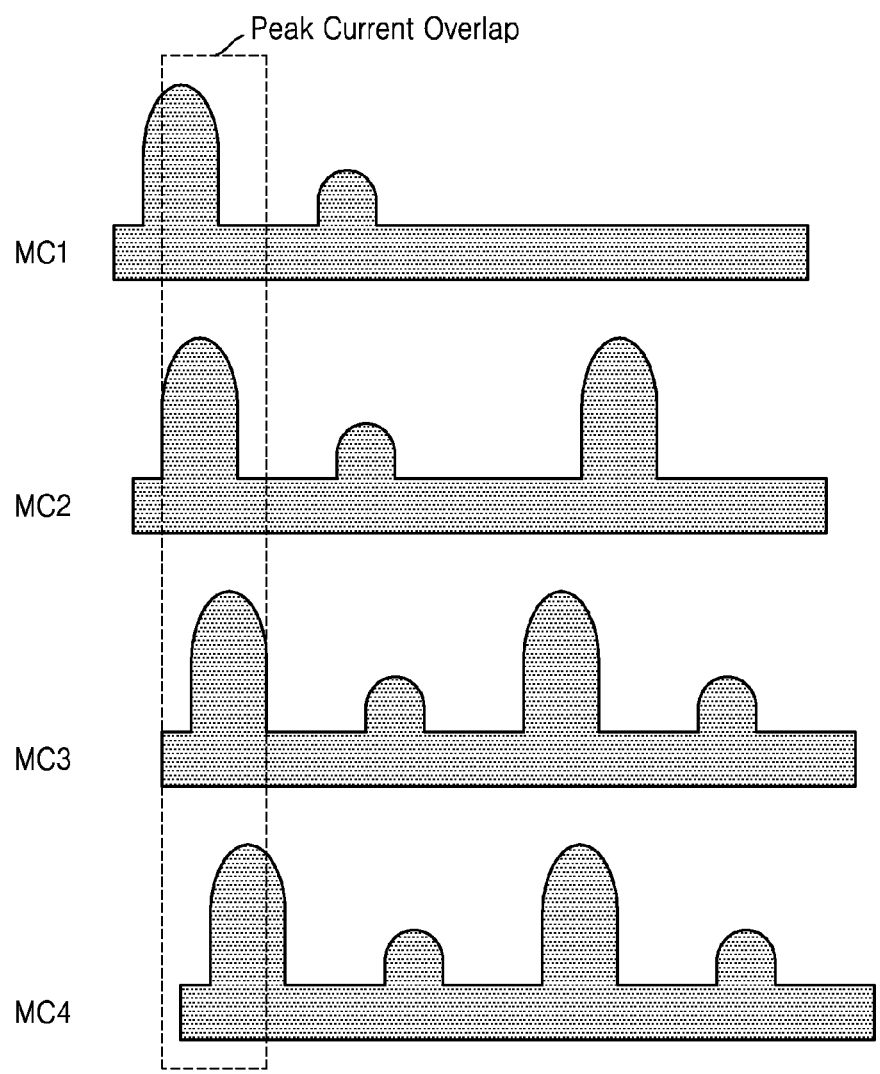
FIG. 25 is a diagram illustrating overlapping peak currents generated by a plurality of NAND flash memory chips.

As indicated by the foregoing, memory system MSYS of FIG. 17 may prevent performance deterioration and reliability reduction caused by overlapping of peak current generation periods of first through fourth NAND flash memory chips MC1 through MC4 as illustrated in FIG. 25.

Figure 26:
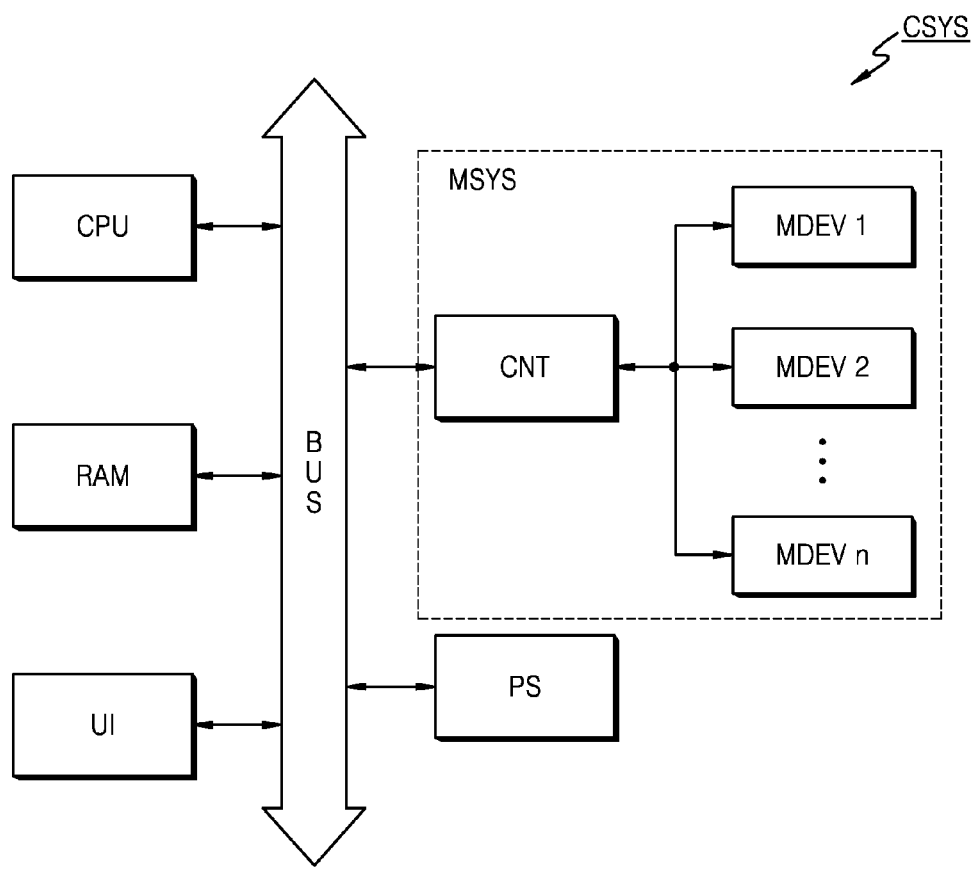
FIG. 26 is a block diagram of a computing system according to an embodiment of the inventive concept.

FIG. 26 is a block diagram of a computing system CSYS according to an embodiment of the inventive concept.

Referring to FIG. 26, computing system CSYS comprises a processor CPU, a user interface UI, and a memory system MSYS, which are electrically connected to a bus BUS. Memory system MSYS comprises a controller CNT and first through n-th memory devices MDEV1 through MDEVn. Each of first through n-th memory devices MDEV1 through MDEVn stores N-bit data (N is an integer greater than or equal to 1) processed or to be processed by processor CPU by control of controller CNT. Memory system MSYS of FIG. 26 may be memory system MSYS of FIG. 1.

Computing system CSYS further comprises a power supplier PS. Also, if first through n-th memory devices MDEV1 through MDEVn are flash memory devices, computing system CSYS can further comprise a volatile memory device (e.g., a random access memory (RAM)).

Where computing system CSYS is a mobile device, a battery for providing an operation voltage of computing system CSYS and a modem such as a baseband chipset may be additionally provided. Also, computing system CSYS can further comprise well-known elements such as an application chipset, a camera image processor (CIS), a mobile dynamic RAM (DRAM), etc. and detailed descriptions thereof are not provided here.

Figure 27:
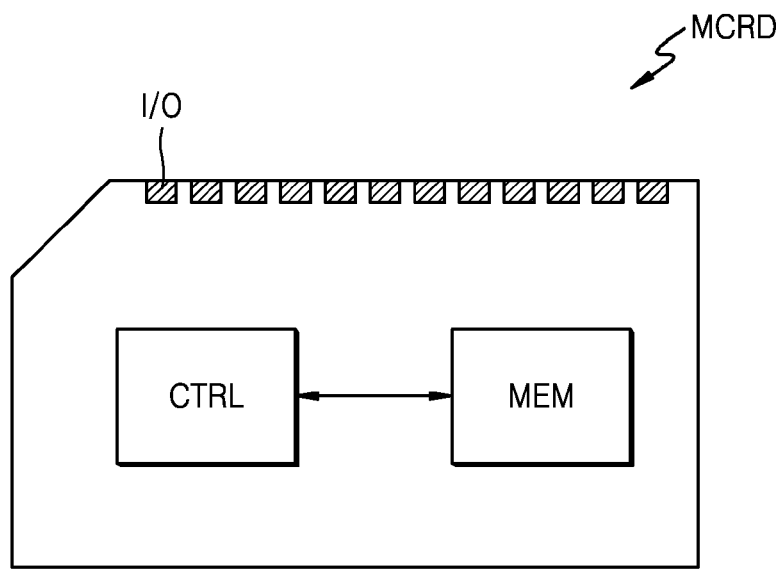
FIG. 27 is a diagram of a memory card according to an embodiment of the inventive concept.

FIG. 27 is a diagram of a memory card MCRD according to an embodiment of the inventive concept.

Referring to FIG. 27, memory card MCRD comprises a memory controller CTRL and a memory device MEM. Memory controller CTRL controls a write and read operations of memory device MEM in response to a request of an external host, which is received via an input/output (I/O) interface. Where memory device MEM is a flash memory device, memory controller CTRL controls an erase operation on memory device MEM. To control the write, read, and erase operations of data, memory controller CTRL of memory card MCRD comprises an interface for interfacing between a host and memory device MEM, and a RAM (not shown). In particular, memory controller CTRL of memory card MCRD can be controller CNT of FIG. 1 or 15, etc. Also, memory device MEM of memory card MCRD may be first through n-th memory devices MDEV1 through MDEVn of FIG. 1 or 15.

Memory card MCRD can be, for example, a compact flash card (CFC), a microdrive, a smart media card (SMC), a multimedia card (MMC), a security digital card (SDC), a memory stick, a universal serial bus (USB) flash memory driver.

Figure 28:
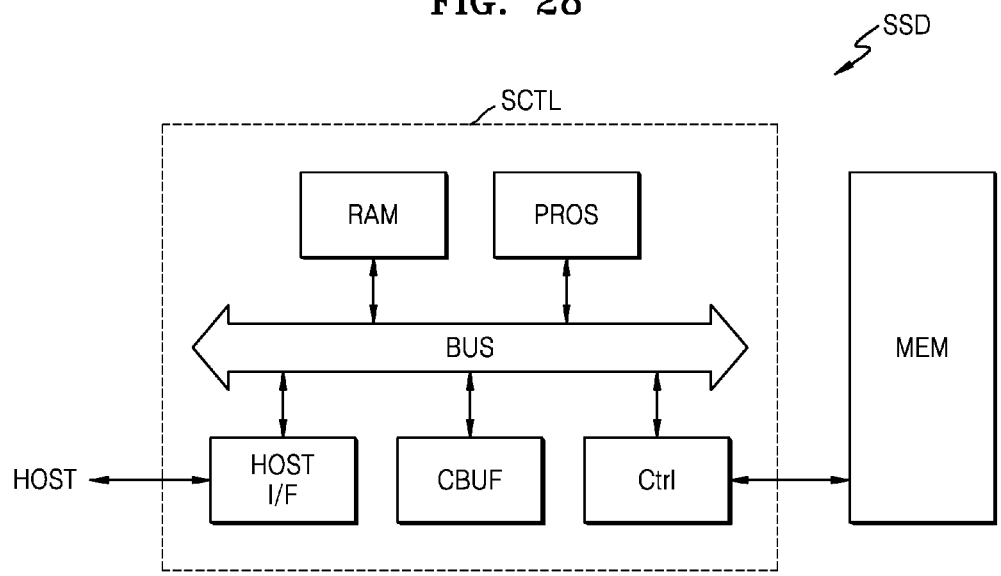
FIG. 28 is a block diagram of a solid state drive (SSD) according to an embodiment of the inventive concept.

FIG. 28 is a block diagram of an SSD according to an embodiment of the inventive concept.

Referring to FIG. 28, the SSD comprises an SSD controller SCTL and a memory device MEM. SSD controller SCTL comprises a processor PROS, a RAM, a cache buffer CBUF, and a memory controller CTRL, which are connected via a bus BUS. Processor PROS controls memory controller CTRL to transmit and receive data to and from memory device MEM in response to a request (e.g., a command, an address, or data) of a host. Processor PROS and memory controller CTRL of the SSD may be implemented as one ARM processor. Data for operating processor PROS may be loaded to the RAM.

A host interface HOST I/F transmits the request received from the host to processor PROS, or transmits data received from memory device MEM to the host. Host interface HOST I/F can interface with the host using one of various interface protocols such as USB, man machine communication (MMC), peripheral component interconnect-express (PCI-E), serial advanced technology attachment (SATA), parallel advanced technology attachment (PATA), small computer system interface (SCSI), enhanced small device interface (ESDI), or intelligent drive electronics (IDE). The data transmitted from or to be transmitted to memory device MEM may be temporarily stored in cache buffer CBUF. Cache buffer CBUF may be, for example, a static RAM (SRAM).

Memory controller CTRL and memory device MEM of the SSD may be, for example, controller CNT and first through n-th memory devices MDEV1 through MDEVn of FIG. 1 or 15.

Figure 29:
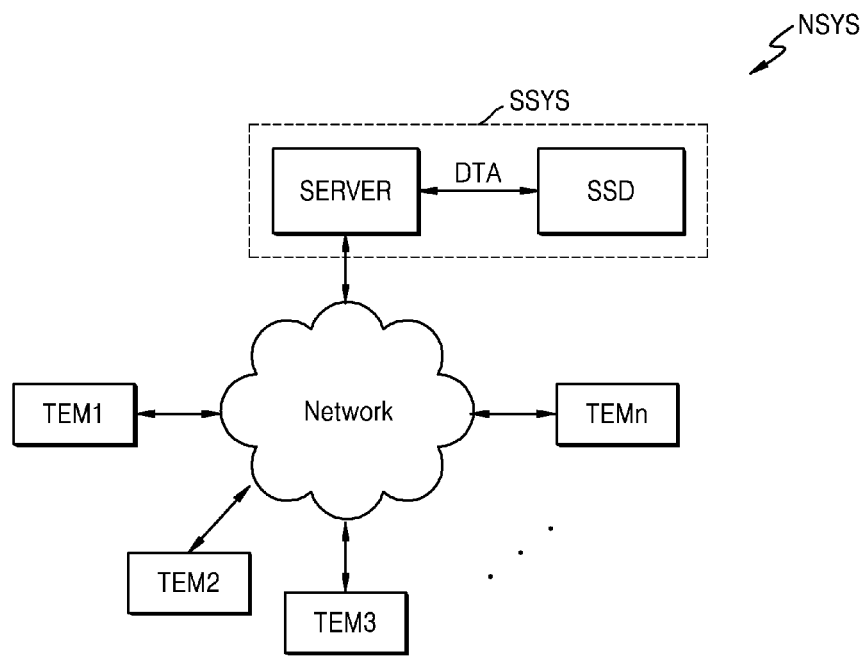
FIG. 29 is a schematic diagram of a server system comprising an SSD and a network system comprising the server system according to an embodiment of the inventive concept.

FIG. 29 is a schematic diagram of a server system SSYS comprising an SSD and a network system NSYS comprising server system SSYS, according to an embodiment of the inventive concept.

Referring to FIG. 29, network system NSYS comprises server system SSYS and first through n-th terminals TEM1 through TEMn, which are connected in a network. Server system SSYS comprises a server SERVER for processing requests received from first through n-th terminals TEM1 through TEMn, and the SSD for storing data corresponding to the requests received from first through n-th terminals TEM1 through TEMn. In this case, SSD of FIG. 29 may be SSD of FIG. 28. That is, SSD of FIG. 29 comprises controller CNT and first through n-th memory devices MDEV1 through MDEVn of FIG. 1 or 15. Accordingly, network system NSYS may efficiently control the generation of peak currents. The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A memory system comprising a plurality of memory devices and a controller, each of the memory devices comprising:
   an internal clock generator that generates an internal clock in synchronization with a processor clock received from the controller, in response to the processor clock; and
   a memory that performs a peak current generation operation within a peak current generation period in synchronization with the internal clock,
   wherein two or more of the memory devices generate their respective internal clocks at different times, and
   wherein the controller monitors a peak signal transmitted from the plurality of memory devices and activates the processor clock differently in response to the peak signal.

2. The memory system of claim 1, wherein the respective internal clocks of the memory devices are activated at different edges of the processor clock.

3. The memory system of claim 1, wherein the respective internal clocks of all of the memory devices are activated at different times with respect to the same processor clock.

4. The memory system of claim 1, wherein the processor clock has a cycle time corresponding to the peak current generation period, and wherein the memory devices are sequentially activated at corresponding edges of the processor clock.

5. The memory system of claim 1, wherein the internal clocks of first and second memory devices among the memory devices are simultaneously activated.

6. The memory system of claim 1, wherein the peak current generation period is set differently according to a type of operation performed by the memory.

7. The memory system of claim 6, wherein the peak current generation period is set to correspond to at least one of a bitline setup period for programming data in the memory and a bitline precharge period for verifying the programmed data.

8. A memory system comprising a plurality of memory devices and a controller, each of the memory devices comprising:
- an internal clock generator that generates an internal clock in synchronization with a processor clock received from the controller, in response to the processor clock;
- a memory that performs a peak current generation operation within a peak current generation period in synchronization with the internal clock,
- wherein two or more of the memory devices generate their respective internal clocks at different times; and
- a timer for counting time passed from a first time, wherein the period of the peak current generation operation is set differently according to the time passed from the first time,
- wherein the controller monitors a peak signal transmitted from the plurality of memory devices and activates the processor clock differently in response to the peak signal.

9. A memory system comprising a plurality of memory devices and a controller, each of the memory devices comprising:
- an internal clock generator that generates an internal clock in synchronization with a processor clock received from the controller, in response to the processor clock;
- a memory that performs a peak current generation operation within a peak current generation period in synchronization with the internal clock,
- wherein two or more of the memory devices generate their respective internal clocks at different times; and
- a counter for counting a number of times that a first operation is repeated, wherein the peak current generation period is set according to the number of times that the first operation is repeated,
- wherein the controller monitors a peak signal transmitted from the plurality of memory devices and activates the processor clock differently in response to the peak signal.

10. The memory system of claim 1, wherein the peak current generation period of a first memory device among the memory devices is set differently from the peak current generation period of a second memory device.

* * * * *